United States Patent
Yoo et al.

(10) Patent No.: US 9,577,043 B2
(45) Date of Patent: Feb. 21, 2017

(54) SEMICONDUCTOR DEVICE AND METHOD FOR FABRICATING THE SAME

(71) Applicants: Jongryeol Yoo, Osan-si (KR); Hyun Jung Lee, Suwon-si (KR); Sunjung Kim, Suwon-si (KR); Seung Hun Lee, Hwaseong-si (KR); Eunhye Choi, Daejeon (KR)

(72) Inventors: Jongryeol Yoo, Osan-si (KR); Hyun Jung Lee, Suwon-si (KR); Sunjung Kim, Suwon-si (KR); Seung Hun Lee, Hwaseong-si (KR); Eunhye Choi, Daejeon (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/826,174

(22) Filed: Aug. 13, 2015

(65) Prior Publication Data

US 2016/0104775 A1    Apr. 14, 2016

(30) Foreign Application Priority Data

Oct. 10, 2014 (KR) .......................... 10-2014-0136835

(51) Int. Cl.
| H01L 29/10 | (2006.01) |
| H01L 29/165 | (2006.01) |
| H01L 29/78 | (2006.01) |
| H01L 21/8238 | (2006.01) |
| H01L 27/092 | (2006.01) |
| H01L 27/088 | (2006.01) |
| H01L 21/8234 | (2006.01) |

(52) U.S. Cl.
CPC ... *H01L 29/1054* (2013.01); *H01L 21/823814* (2013.01); *H01L 27/092* (2013.01); *H01L 29/165* (2013.01); *H01L 29/7849* (2013.01); *H01L 21/823412* (2013.01); *H01L 27/088* (2013.01); *H01L 27/0886* (2013.01); *H01L 27/0924* (2013.01)

(58) Field of Classification Search
CPC .... H01L 29/10; H01L 21/8234; H01L 27/088; H01L 29/165; H01L 29/78; H01L 29/7849; H01L 27/0886; H01L 27/092; H01L 29/1054
USPC .......................................... 257/190; 438/285
See application file for complete search history.

(56) References Cited

U.S. PATENT DOCUMENTS

| 7,214,598 B2 | 5/2007 | Capewell et al. |
| 7,384,837 B2 | 6/2008 | Hsu et al. |
| 7,550,370 B2 | 6/2009 | Chen et al. |

(Continued)

*Primary Examiner* — Selim Ahmed
(74) *Attorney, Agent, or Firm* — Muir Patent Law, PLLC

(57) ABSTRACT

A semiconductor device includes a buffer layer on a semiconductor substrate including first and second regions, a first channel layer on the buffer layer of the first region, a second channel layer on the buffer layer of the second region, and a spacer layer between the second channel layer and the buffer layer. The buffer layer, the first and second channel layers, and the spacer layer are formed of semiconductor materials including germanium. A germanium concentration difference between the first and second channel layers is greater than a germanium concentration difference between the buffer layer and the second channel layer. The spacer layer has a germanium concentration gradient.

30 Claims, 27 Drawing Sheets

(56) References Cited

U.S. PATENT DOCUMENTS

| | | |
|---|---|---|
| 7,662,689 B2 | 2/2010 | Boyanov et al. |
| 7,714,361 B2 | 5/2010 | Griglion |
| 7,993,998 B2 * | 8/2011 | Chen ................ H01L 21/82380 257/E21.632 |
| 8,586,438 B2 | 11/2013 | Tamura et al. |
| 8,610,175 B2 | 12/2013 | Hong et al. |
| 8,623,728 B2 | 1/2014 | Chang et al. |
| 2006/0145188 A1 | 7/2006 | Dantz et al. |
| 2009/0142892 A1 * | 6/2009 | Lee ................... H01L 21/82380 438/218 |
| 2010/0144124 A1 | 6/2010 | Kim et al. |
| 2012/0012906 A1 | 1/2012 | Wang et al. |
| 2012/0161249 A1 | 6/2012 | Kronholz et al. |

* cited by examiner

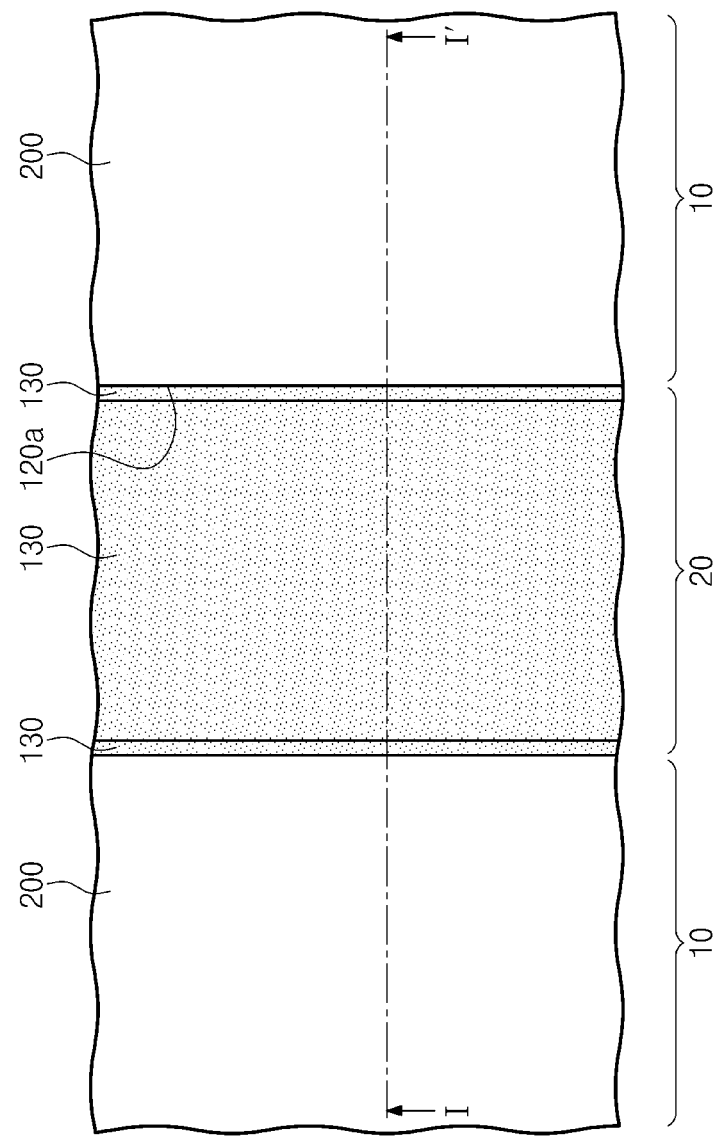

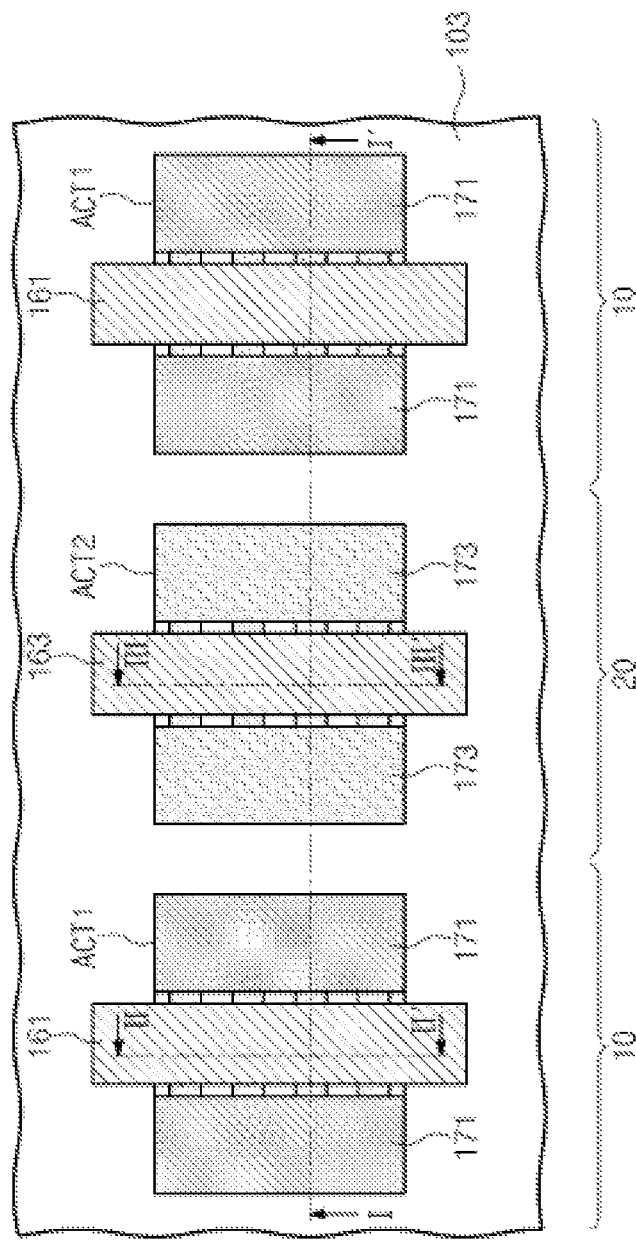

SEMICONDUCTOR DEVICE AND METHOD FOR FABRICATING THE SAME

CROSS-REFERENCE TO RELATED APPLICATION

This U.S. non-provisional patent application claims priority under 35 U.S.C. §119 to Korean Patent Application No. 10-2014-0136835, filed on Oct. 10, 2014, in the Korean Intellectual Property Office, the disclosure of which is hereby incorporated by reference in its entirety.

BACKGROUND

The present disclosure relates to semiconductor devices, electronic devices and methods for fabricating the same. The disclosure also relates to semiconductor devices including fin field effect transistors and methods for fabricating the same.

A semiconductor device may include an integrated circuit including metal-oxide-semiconductor (MOS) field effect transistors. Sizes of MOS field effect transistors have been increasingly reduced as semiconductor devices have been highly integrated, so operating characteristics of semiconductor devices have been deteriorated. Various methods for forming excellent performance semiconductor devices have been developed to overcome limitations caused by the high integration density of semiconductor devices. In particular, a method of increasing mobility of electrons or holes has been developed to realize high-performance MOS field effect transistors.

SUMMARY

Embodiments of the inventive concepts may provide semiconductor devices capable of improving an integration density and electrical characteristics.

Embodiments of the inventive concepts may also provide methods for fabricating a semiconductor device capable of improving an integration density and electrical characteristics.

In one aspect, a semiconductor device may include a semiconductor substrate including first and second regions, a buffer layer formed on the semiconductor substrate in the first and second regions, a first channel layer formed on the buffer layer of the first region, a second channel layer formed on the buffer layer of the second region, and a spacer layer disposed between the second channel layer and the buffer layer. The buffer layer, the first and second channel layers, and the spacer layer may be formed of semiconductor materials including germanium (Ge). A germanium concentration difference between the first channel layer and the second channel layer may be greater than a germanium concentration difference between the buffer layer and the second channel layer. The spacer layer may have a germanium concentration gradient.

In some embodiments, the buffer layer may have a first germanium concentration. The second channel layer may have a second germanium concentration greater than the first germanium concentration. The germanium concentration of the spacer layer may have a graded profile such that a region adjacent to a bottom surface of the spacer layer has a first germanium concentration and a region adjacent to a top surface of the spacer layer has a second germanium concentration greater than the first germanium concentration.

In some embodiments, a top surface of the second channel layer may be coplanar with a top surface of the first channel layer. A thickness of the second channel layer may be smaller than a thickness of the first channel layer.

In some embodiments, a top surface of the second channel layer may be coplanar with a top surface of the first channel layer. A thickness of the second channel layer may be substantially equal to or greater than a thickness of the first channel layer.

In some embodiments, wherein the germanium concentration of the spacer layer may have a discontinuously varied profile.

In some embodiments, the germanium concentration of the spacer layer may have a continuously varied profile.

In some embodiments, the spacer layer may include: a first portion being in contact with the buffer layer and having a uniform germanium concentration, and a second portion being in contact with the second channel layer and having the germanium concentration gradient.

In some embodiments, the spacer layer may include a first portion being in contact with the buffer layer, a second portion being in contact with the second channel layer, and a third portion between the first portion and the second portion. Each of the first to third portions may have a uniform germanium concentration. The germanium concentration of the third portion may be greater than the germanium concentration of the first portion and smaller than the germanium concentration of the second portion.

In some embodiments, the buffer layer may be formed of $Si_{1-x}Ge_x$ (0<x<1), and the first channel layer may be formed of $Si_{1-y}Ge_y$ (0≤y<x). The second channel layer may be formed of $Si_{1-z}Ge_z$ (x<z≤1), and the spacer layer may be formed of $Si_{1-w}Ge_w$ (x≤w<z).

In some embodiments, the semiconductor device may further include a first gate electrode formed on the first channel layer, first source/drain patterns disposed at opposite sides of the first gate electrode, a second gate electrode formed on the second channel layer, and second source/drain patterns disposed at opposite sides of the second gate electrode. The first source/drain patterns may be formed of a semiconductor material of which a lattice constant is different from that of the second source/drain patterns.

In another aspect, a semiconductor device may include a semiconductor substrate including first and second regions, a buffer layer formed on the semiconductor substrate, the buffer layer having a lattice constant different from that of the semiconductor substrate, a first channel layer formed on the buffer layer of the first region, the first channel layer having a lattice constant smaller than the lattice constant of the buffer layer, a second channel layer formed on the buffer layer of the second region, the second channel layer having a lattice constant greater than the lattice constant of the buffer layer, and a spacer layer disposed between the second channel layer and the buffer layer, the spacer layer having a lattice constant that gradually increases from a top surface of the buffer layer toward a bottom surface of the second channel layer. Top surfaces of the first and second channel layers may be coplanar with each other, and a bottom surface of the spacer layer may be disposed at substantially the same level as or a lower level than a bottom surface of the first channel layer.

In still another aspect, a semiconductor device may include a semiconductor substrate including a first region and a second region, a first fin structure on the first region, the first fin structure including a first buffer pattern and a first channel pattern sequentially stacked, a second fin structure on the second region, the second fin structure including a second buffer pattern, a second channel pattern on the second buffer pattern, and a spacer pattern disposed between the second buffer pattern and the second channel pattern, a first metal-oxide-semiconductor (MOS) transistor provided on the first region and including a first gate electrode, and a first gate insulating layer between the first fin structure and the first gate electrode, and a second MOS transistor provided on the second region and including a second gate electrode, and a second gate insulating layer between the second fin structure and the second gate electrode. The first and second buffer patterns may include a first semiconductor material of which a lattice constant is different from that of the semiconductor substrate, and the first channel pattern may include a second semiconductor material of which a lattice constant is smaller than the lattice constant of the first semiconductor material. The second channel pattern may include a third semiconductor material of which a lattice constant is greater than the lattice constant of the first semiconductor material, and the spacer pattern may have a lattice constant that gradually increases from the second buffer pattern toward the second channel pattern.

In yet another aspect, a method for fabricating a semiconductor device may include providing a semiconductor substrate including first and second regions, forming a buffer layer on the semiconductor substrate, forming a first channel layer on the buffer layer, patterning the first channel layer to form an opening exposing the buffer layer of the second region, forming a spacer layer conformally covering a sidewall of the first channel layer and a surface of the buffer layer which are exposed through the opening, and forming a second channel layer in the opening having the spacer layer. The buffer layer, the first and second channel layers, and the spacer layer may be formed of semiconductor materials including germanium (Ge). A germanium concentration difference between the first channel layer and the second channel layer may be greater than a germanium concentration difference between the buffer layer and the second channel layer, and the spacer layer may have a germanium concentration gradient.

In yet still another aspect, a method for fabricating a semiconductor device may include providing a semiconductor substrate including first and second regions, forming a buffer layer on the semiconductor substrate, the buffer layer including a semiconductor material of which a lattice constant is different from that of the semiconductor substrate, forming a first channel layer on the buffer layer, the first channel layer including a semiconductor material of which a lattice constant is smaller than the lattice constant of the buffer layer; patterning the first channel layer to form an opening exposing the buffer layer of the second region, forming a spacer layer conformally covering a sidewall of the first channel layer and a surface of the buffer layer which are exposed through the opening, the spacer layer including a semiconductor material of which a lattice constant is varied with increasing a distance from the sidewall of the first channel layer, and forming a second channel layer in the opening having the spacer layer, the second channel layer including a semiconductor material of which a lattice constant is greater than the lattice constant of the buffer layer.

In another aspect, an electronic device includes a semiconductor substrate having a first and a second regions, a buffer layer formed on the semiconductor substrate on the first region and on the second region, a first channel layer formed on the buffer layer on the first region, a second channel layer formed on the buffer layer on the second region, and a spacer layer formed between the buffer layer and the second channel layer. The lattice constant of the spacer layer increases gradually from a region adjacent to the buffer layer to a region adjacent to the second channel layer.

The spacer layer may be formed of a semiconductor material including germanium (Ge), and the germanium concentration of the spacer layer increases gradually from a region adjacent to the buffer layer to a region adjacent to the second channel layer. The germanium concentration of the spacer layer may vary continuously. The germanium concentration of the spacer layer may vary discontinuously. The lattice constant of the first channel layer may be smaller than the lattice constant of the buffer layer. The lattice constant of the buffer layer may be smaller than the lattice constant of the second channel layer. The first channel layer, the second channel layer, and the buffer layer may be formed of semiconductor materials including germanium (Ge). The germanium concentration of the second channel layer may be greater than the germanium concentration of the buffer layer. The germanium concentration of the buffer layer may be greater than the germanium concentration of the first channel layer.

The spacer layer may be formed of a semiconductor material including germanium (Ge). The germanium concentration of the spacer layer may increase gradually from a region adjacent to the buffer layer to a region adjacent to the second channel layer. The germanium concentration of the spacer layer may be greater than the germanium concentration of the buffer layer. The germanium concentration of the second channel layer may be greater than the germanium concentration of the spacer layer. The electronic device may further include a first gate electrode formed on the first channel layer, first source/drain patterns disposed at both sides of the first gate electrode, a second gate electrode formed on the second channel layer, and second source/drain patterns disposed at both sides of the second gate electrode. The first gate electrode may be electrically coupled to the second gate electrode. A drain of the first source/drain patterns may be electrically coupled to a drain of the second source/drain patterns. The electronic device may further include a controller, an input/output unit, a memory device, or an interface unit.

In one aspect, a method includes steps: providing a semiconductor substrate including a first region and a second region, providing a buffer layer on the first region and second region of the semiconductor substrate, providing a first channel pattern on the buffer layer of the first region, providing a spacer pattern on the buffer layer of the second region, and providing a second channel pattern on the spacer pattern. The lattice constant of the spacer pattern increases from a surface of the spacer pattern adjacent to the buffer layer to a surface of the spacer pattern adjacent to the second channel pattern.

The lattice constant of the spacer pattern may increase continuously from the surface adjacent to the buffer layer to the surface adjacent to the second channel pattern. The lattice constant of the spacer pattern may increase discontinuously from the surface adjacent to the buffer layer to the surface adjacent to the second channel pattern. The spacer pattern may be formed of a semiconductor material including germanium (Ge). The germanium concentration of the spacer pattern may increase gradually from a region adjacent to the buffer layer to a region adjacent to the second channel pattern. The lattice constant of the first channel pattern may be smaller than the lattice constant of the buffer layer. The lattice constant of the buffer layer may be smaller than the lattice constant of the second channel pattern.

The first channel pattern, the second channel pattern, and the buffer layer may be formed of semiconductor materials including germanium (Ge). The germanium concentration of the second channel pattern may be greater than the germanium concentration of the buffer layer. The germanium concentration of the buffer layer may be greater than the germanium concentration of the first channel pattern. The providing of the spacer pattern may include: patterning the first channel layer to form an opening exposing the buffer layer in the second region, and forming a spacer layer conformally covering a sidewall of the first channel layer and a surface of the buffer layer which are exposed through the opening.

The method may further include steps: providing a first gate insulating layer on the first channel pattern, providing a first gate electrode pattern on the first gate insulating layer, providing a second gate insulating layer on the second channel pattern, providing a second gate electrode pattern on the second gate insulating layer, providing first source/drain patterns at both sides of the first gate electrode pattern, and providing second source/drain patterns at both sides of the second gate electrode pattern. The first gate electrode pattern may be electrically coupled to the second gate electrode pattern. A drain of the first source/drain patterns may be electrically coupled to a drain of the second source/drain patterns.

The method may further include steps: providing a data bus electrically coupled to the first and second gate electrode patterns, and providing a controller configured to send an electrical signal to the first and second gate electrodes through the data bus. The controller may be a microprocessor, a digital processor, or a microcontroller.

The method may further include a step providing an interface unit electrically coupled to the data bus. The interface unit may be an antenna for wireless communication or a transceiver for cable communication.

BRIEF DESCRIPTION OF THE DRAWINGS

Various aspects of the inventive concepts will become more apparent in view of the attached drawings and accompanying detailed description.

FIGS. 2A to 8A are plan views illustrating a method for fabricating a semiconductor device according to some embodiments of the inventive concepts;

FIGS. 2B to 8B are cross-sectional views taken along lines I-I' of FIGS. 2A to 2B, respectively, to illustrate a method for fabricating a semiconductor device according to some embodiments of the inventive concepts;

FIGS. 13A to 16A are graphs illustrating profiles of germanium concentrations corresponding to line A-A' of FIG. 5B to explain germanium concentrations of portions of semiconductor devices according to various embodiments of the inventive concepts;

FIGS. 13B to 16B are graphs illustrating profiles of germanium concentrations corresponding to line B-B' of FIG. 5B to explain germanium concentrations of portions of semiconductor devices according to various embodiments of the inventive concepts;

DETAILED DESCRIPTION OF THE EMBODIMENTS

Figure 1:
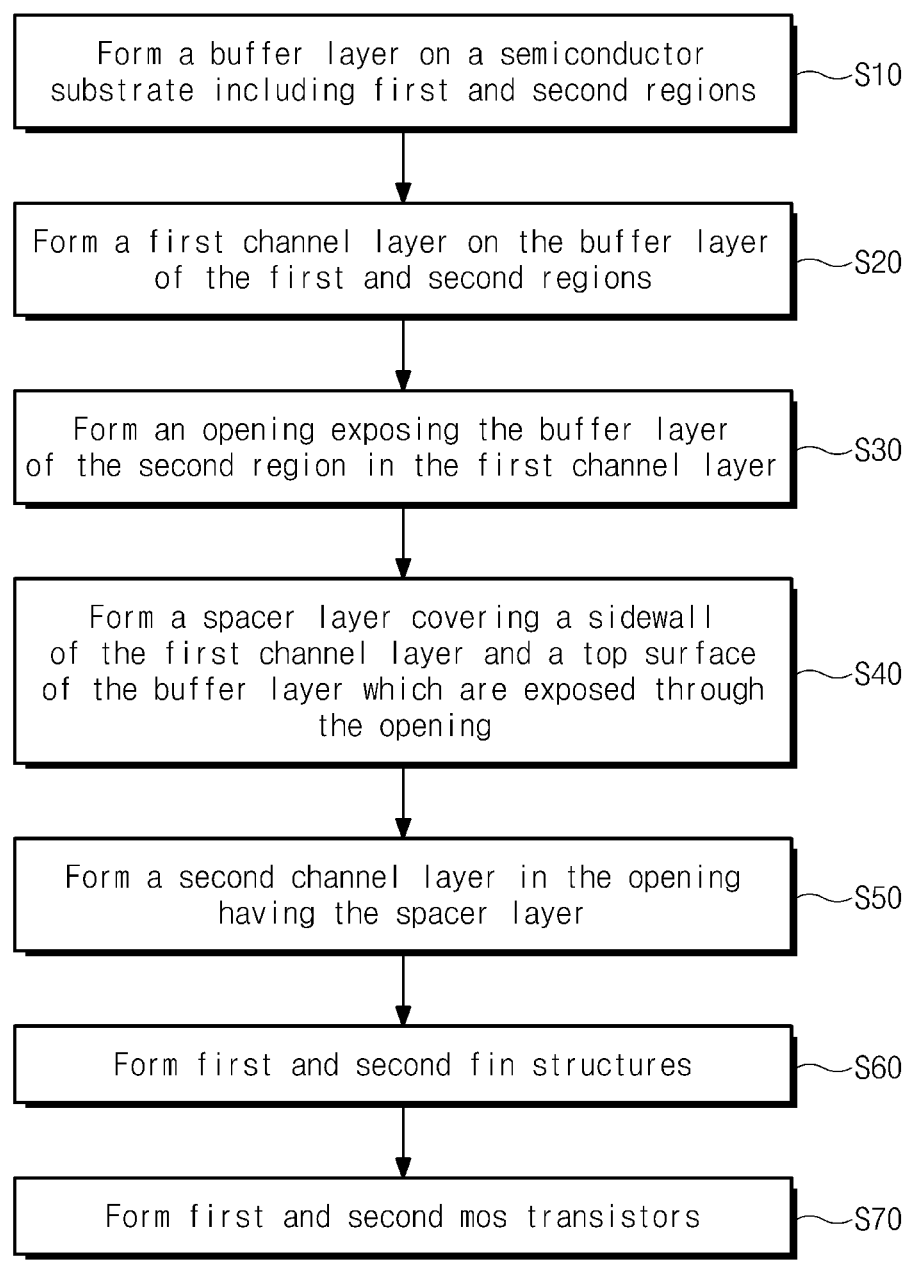
FIG. 1 is a flowchart illustrating a method for fabricating a semiconductor device according to some embodiments of the inventive concepts.

Various aspects of the inventive concepts will now be described more fully hereinafter with reference to the accompanying drawings, in which exemplary embodiments of the inventive concepts are shown. The advantages and features of various aspects of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided to disclose aspects of the inventive concepts and let those skilled in the art know the category thereof. In the drawings, embodiments of the inventive concepts are not limited to the specific examples provided herein and elements and/or components are exaggerated for clarity.

The terminology used herein is for the purpose of describing particular embodiments and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. The term "contact" as used herein, refers to a direct contact, or touching, unless noted otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element, for example, as a naming convention. Thus, a first element in some embodiments could be termed a second element in other embodiments without departing from the teachings of the present invention. Aspects of exemplary embodiments of the present inventive concepts explained and illustrated herein may include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

According to embodiments of the present disclosure, devices and methods of forming devices described herein may be embodied in microelectronic devices such as integrated circuits, wherein a plurality of devices according to various embodiments described herein may be integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device. Microelectronic devices may be also described herein as semiconductor devices and/or electronic devices.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, a semiconductor device may refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

FIG. 1 is a flowchart illustrating a method for fabricating a semiconductor device according to some embodiments of the inventive concepts. FIGS. 2A to 8A are plan views illustrating a method for fabricating a semiconductor device according to some embodiments of the inventive concepts. FIGS. 2B to 8B are cross-sectional views taken along lines I-I' of FIGS. 2A to 2B, respectively, to illustrate a method for fabricating a semiconductor device according to some embodiments of the inventive concepts. FIG. 8C is a cross-sectional view taken along lines II-II' and of FIG. 8A.

Figure 2A:
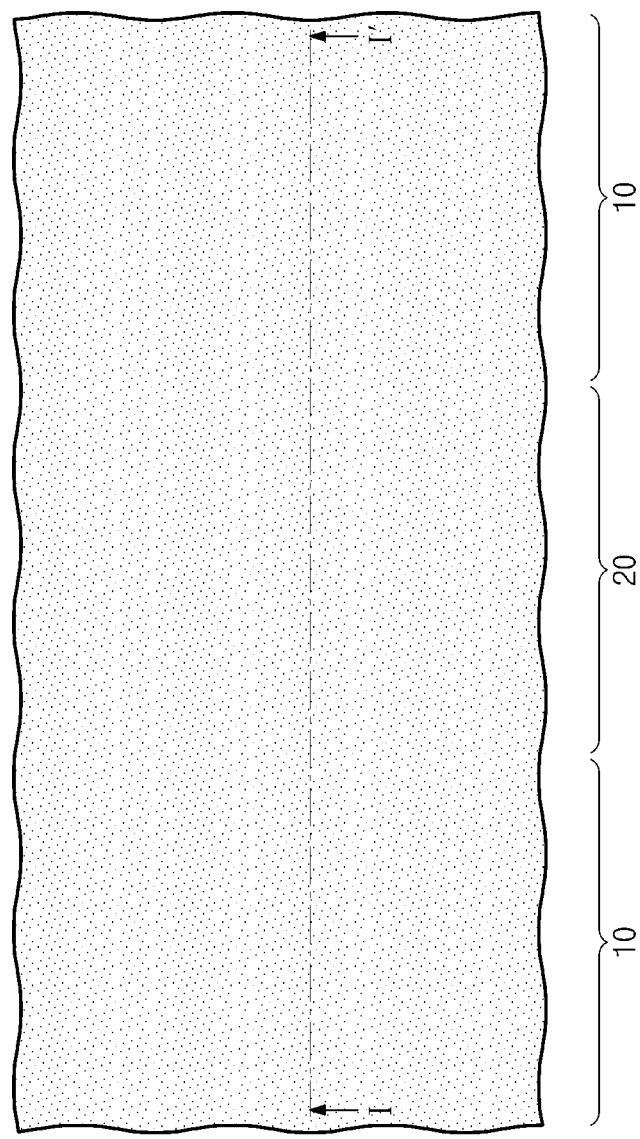
Figure 2B:
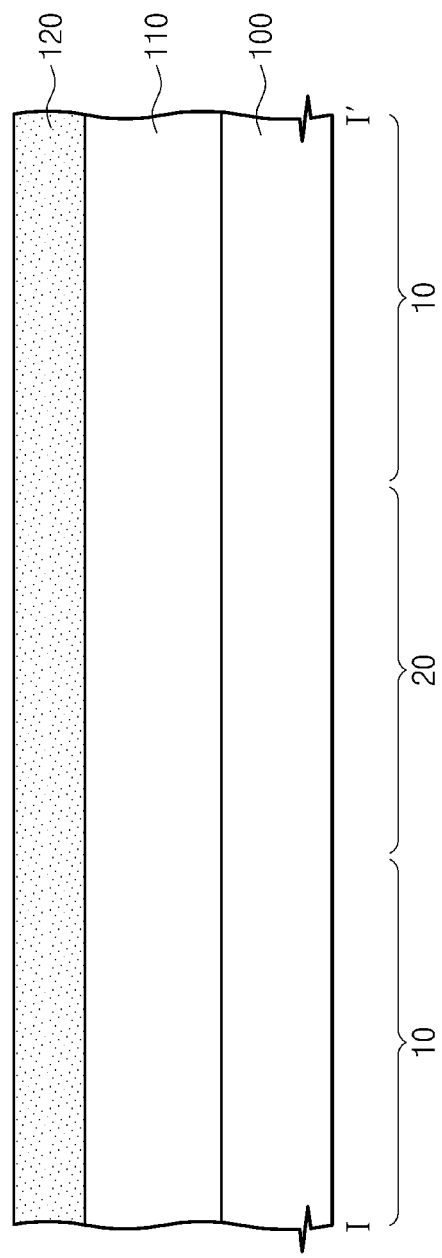

Referring to FIGS. 1, 2A, and 2B, a buffer layer 110 may be formed on a semiconductor substrate 100 including first and second regions 10 and 20 (S10).

According to an embodiment, the semiconductor substrate 100 may be a single-crystalline silicon substrate. Alternatively, the semiconductor substrate 100 may be a silicon-on-insulator (SOI) substrate, a germanium substrate, a germanium-on-insulator (GOI) substrate, a silicon-germanium substrate, or a substrate including an epitaxial layer formed by a selective epitaxial growth (SEG) process.

In some embodiments, the buffer layer 110 may be formed of a semiconductor material that has the same lattice structure as the semiconductor substrate 100 but has a lattice constant greater than that of the semiconductor substrate 100. For example, the buffer layer 110 may include, germanium (Ge), silicon-germanium (SiGe), or a III-V group compound semiconductor. The III-V group compound semiconductor may be, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

As used herein, a lattice constant may refer to an average lattice constant value of a bulk layer unless the context indicates otherwise. For example, the lattice constant of a layer may refer to the average lattice constant of the layer. In another example, a lattice constant may not refer to an average lattice constant of a bulk when the context indicates that the lattice constant is gradient or that the lattice constant is that of a small area. For example, the lattice constant at a boundary of a first and a second layers may refer to a lattice constant of a sectional area. The lattice constant of the sectional area may refer to an average lattice constant of a particular sectional area.

If the semiconductor substrate 100 is the single-crystalline silicon substrate, the buffer layer 110 may be formed by an epitaxial growth process using the semiconductor substrate 100 as a seed. During the epitaxial growth process, the buffer layer 110 may be formed with germanium (Ge) and silicon (Si). The lattice constant of germanium (Ge) is greater than that of silicon (Si). The epitaxial growth process may be performed by a vapor phase epitaxy (VPE) process, a liquid phase epitaxy (LPE), or a molecular beam epitaxy (MBE) process.

In some embodiments, the buffer layer 110 may be formed of $Si_{1-x}Ge_x$ (0<x<1). In an embodiment, the buffer layer 110 may have a uniform germanium (Ge) concentration. For example, a germanium concentration in the buffer layer 110 may be in a range of about 10% to about 45%.

In other embodiments, the buffer layer 110 may be formed of graded $Si_{1-x}Ge_x$ (0<x<1). In this case, a germanium concentration of the buffer layer 110 may be graded in a range of about 0% to about 45%. The germanium concentration of the buffer layer 110 may gradually increase from a lower portion toward an upper portion of the buffer layer 110. For example, the concentration of a germanium source may gradually increase during the epitaxial growth process for forming the buffer layer 110. Here, since a lattice constant of germanium is greater than that of silicon, a lattice constant of the buffer layer 110 may gradually increase from the lower portion to the upper portion of the buffer layer 110. In addition, since the germanium concentration of the buffer layer 110 gradually increases toward the upper portion of the buffer layer 110, it is possible to minimize transition of lattice dislocations from an interface between the semiconductor substrate 100 and the buffer layer 110 to a first channel layer 120.

According to an embodiment, the buffer layer 110 may have a thick thickness of about 20 nm or more, so a strain may be relaxed in the buffer layer 110. As such, the buffer layer 110 may be formed of a relaxed silicon-germanium (SiGe) layer.

Referring continuously to FIGS. 1, 2A, and 2B, the first channel layer 120 may be formed on the buffer layer 110 of the first and second regions 10 and 20 (S20).

The first channel layer 120 may be formed of a semiconductor material that has the same lattice structure as the buffer layer 110 but has a lattice constant smaller than that of the buffer layer 110. The lattice constant of the first channel layer 120 may be, for example, uniform throughout the entire portion of the first channel layer 120.

Lattices of the first channel layer 120 formed on the relaxed buffer layer 110 may be horizontally strained by matching between the lattices of the first channel layer 120 and the lattices of the buffer layer 110. Thus, a tensile strain may be induced in the first channel layer 120. For example, the first channel layer 120 may be formed of a material that has a lattice constant smaller than that of the buffer layer 110 and is selected from a group consisting of silicon (Si), silicon-germanium (SiGe), and a III-V group compound semiconductor. Here, the III-V group compound semiconductor may be, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

The first channel layer 120 may be grown from the buffer layer 110 by an epitaxial growth process (e.g., a chemical vapor deposition (CVD) process or a molecular beam epitaxy (MBE) process).

In an embodiment, the first channel layer 120 may be formed of a semiconductor material including germanium (Ge). The first channel layer 120 may be formed by an epitaxial growth process using the buffer layer 110 as a seed and may be formed with germanium (Ge) and silicon (Si). Germanium and silicon material may be provided during the epitaxial growth process with a predetermined proportion. The first channel layer 120 may have a uniform germanium concentration. The germanium concentration of the first channel layer 120 may be lower than that of the upper portion of the buffer layer 110. Thus, the lattice constant of the first channel layer 120 may be smaller than that of the upper portion of the buffer layer 110. In some embodiments, the lattice constant of the first channel layer 120 may be smaller than that of the buffer layer 110. For example, the first channel layer 120 may be formed of $Si_{1-y}Ge_y$ (0≤y<x). The germanium concentration of the first channel layer 120 may be in a range of about 0% to about 45%. The germanium concentration difference at an interface between the first channel layer 120 and the buffer layer 110 may be in a range of about 0% to about 45%.

Figure 3A:
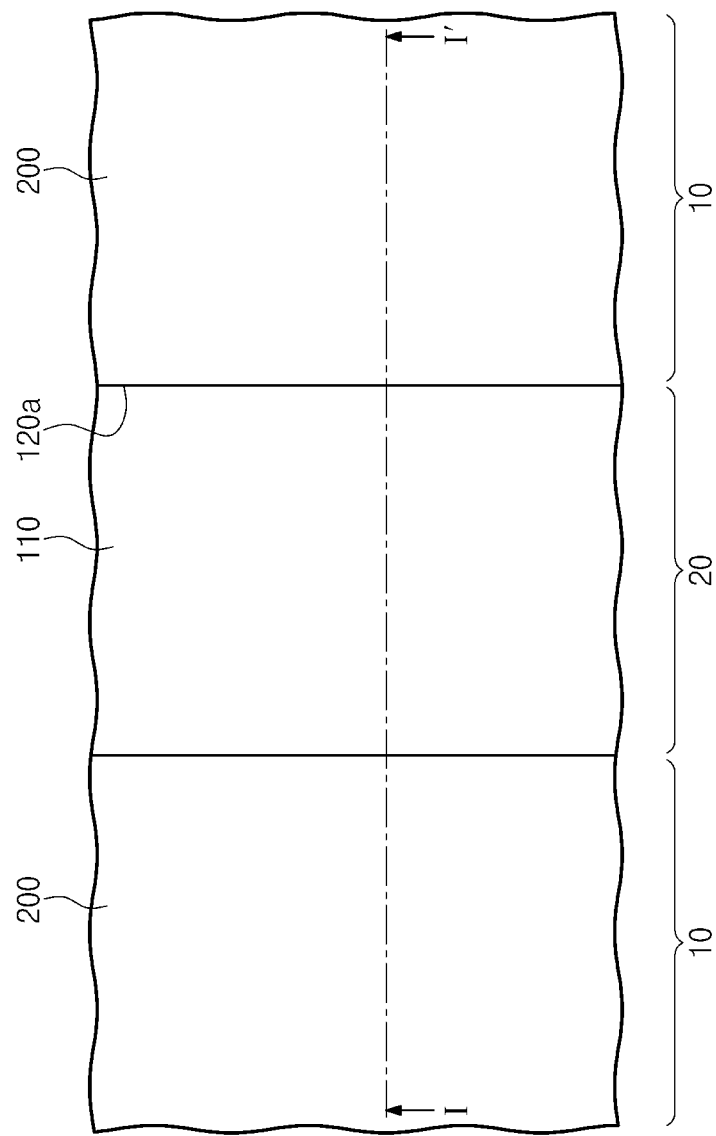
Figure 3B:
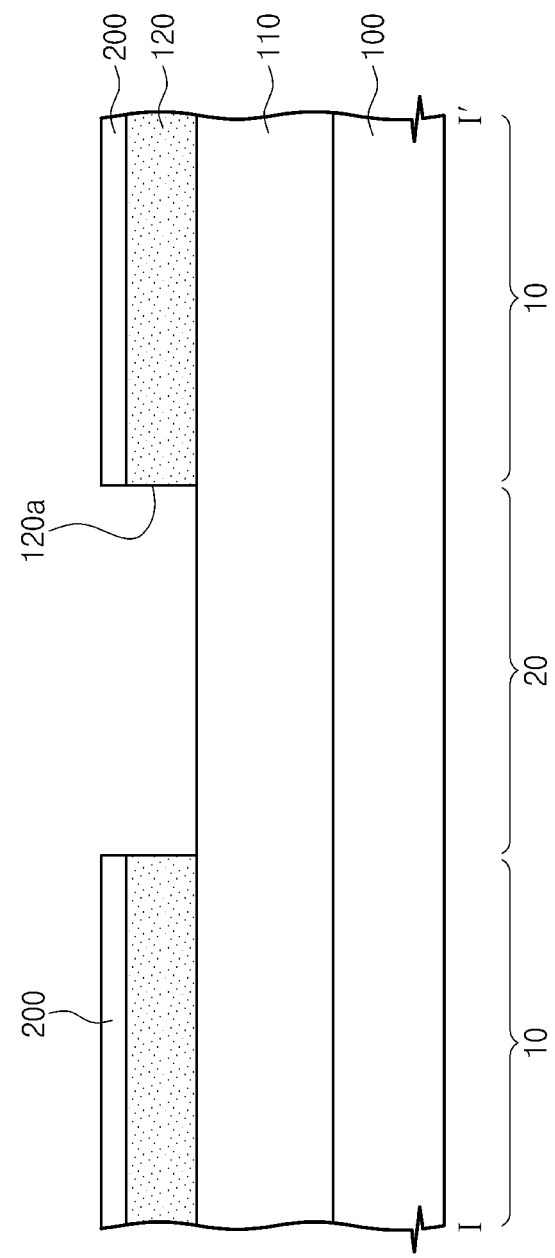

Referring to FIGS. 1, 3A, and 3B, the first channel layer 120 may be patterned to form an opening 120a exposing the buffer layer 110 of the second region 20 (S30).

For example, a mask pattern 200 may be formed to cover the first channel layer 120 of the first region 10. The mask pattern 200 may expose the first channel layer 120 of the second region 20. Subsequently, the first channel layer 120 may be anisotropically etched using the mask pattern 200 as an etch mask until a top surface of the buffer layer 110 is exposed, thereby forming the opening 120a in the first channel layer 120 of the second region 20. The opening 120a may expose the top surface of the buffer layer 110 and a sidewall of the first channel layer 120 in the second region 20. The top surface of the buffer layer 110 exposed through the opening 120a may be recessed during the anisotropic etching process for forming the opening 120a. In this case, the top surface of the buffer layer 110 of the second region 20 may be lower than a top surface of the buffer layer 110 of the first region 10. In other words, a depth of the opening 120a may be substantially equal to or greater than a thickness of the first channel layer 120.

Figure 4B:
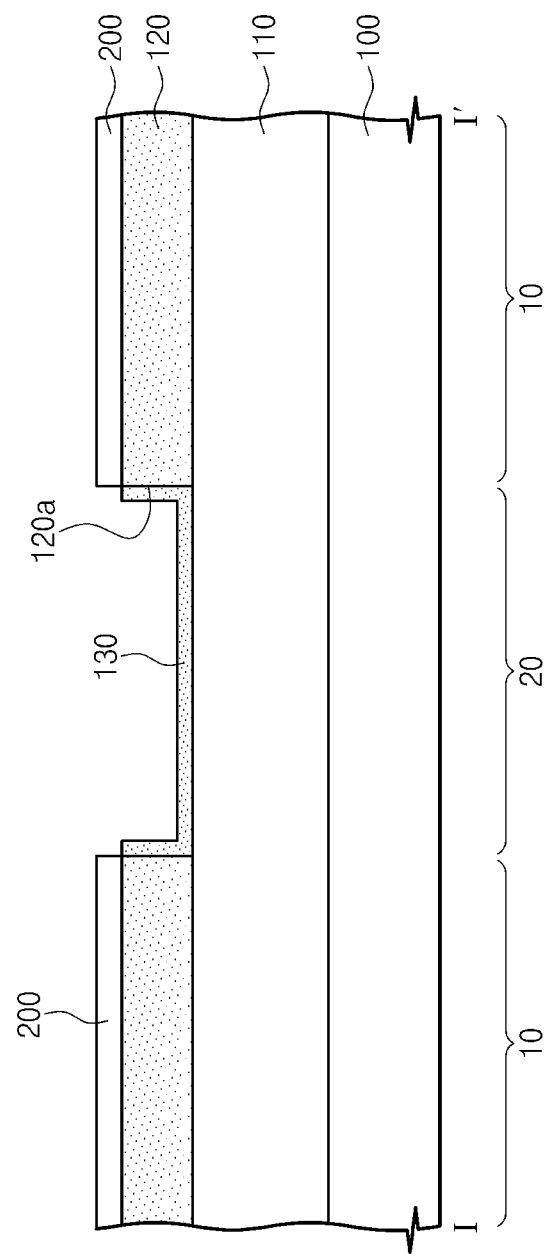

Referring to FIGS. 1, 4A, and 4B, a spacer layer 130 may be formed to cover the top surface of the buffer layer 110 and the sidewall of the first channel layer 120 which are exposed through the opening 120a (S40).

The spacer layer 130 may be formed of a semiconductor material that has the same lattice structure as the buffer layer 110 and has a lattice constant equal to or greater than that of the upper portion of the buffer layer 110. The difference in the lattice constant between the spacer layer 130 and the first channel layer 120 may be smaller than the difference in the lattice constant between the buffer layer 110 and the first channel layer 120. For example, the spacer layer 130 may include Ge, SiGe, or a III-V group compound semiconductor.

According to an embodiment, the spacer layer 130 may be formed of a semiconductor material including germanium (Ge). The spacer layer 130 may be epitaxially-grown from the top surface of the buffer layer 110 and the sidewall of the first channel layer 120 and may be formed with germanium (Ge) and silicon (Si) during the epitaxial growth process. The concentration of germanium formed during the epitaxial growth process may be variously modified. These will be described in more detail with reference to FIGS. 12A to 16A, 12B to 16B, and 12C.

In some embodiments, the spacer layer 130 may have a substantially uniform thickness on the top surface of the buffer layer 110 and the sidewall of the first channel layer 120. The spacer layer 130 may be thinner than the first channel layer 120. A bottom surface of the spacer layer 130 formed on the buffer layer 110 of the second region 20 may be disposed at substantially the same level as a bottom surface of the first channel layer 120 or may be lower than the bottom surface of the first channel layer 120.

Figure 5A:
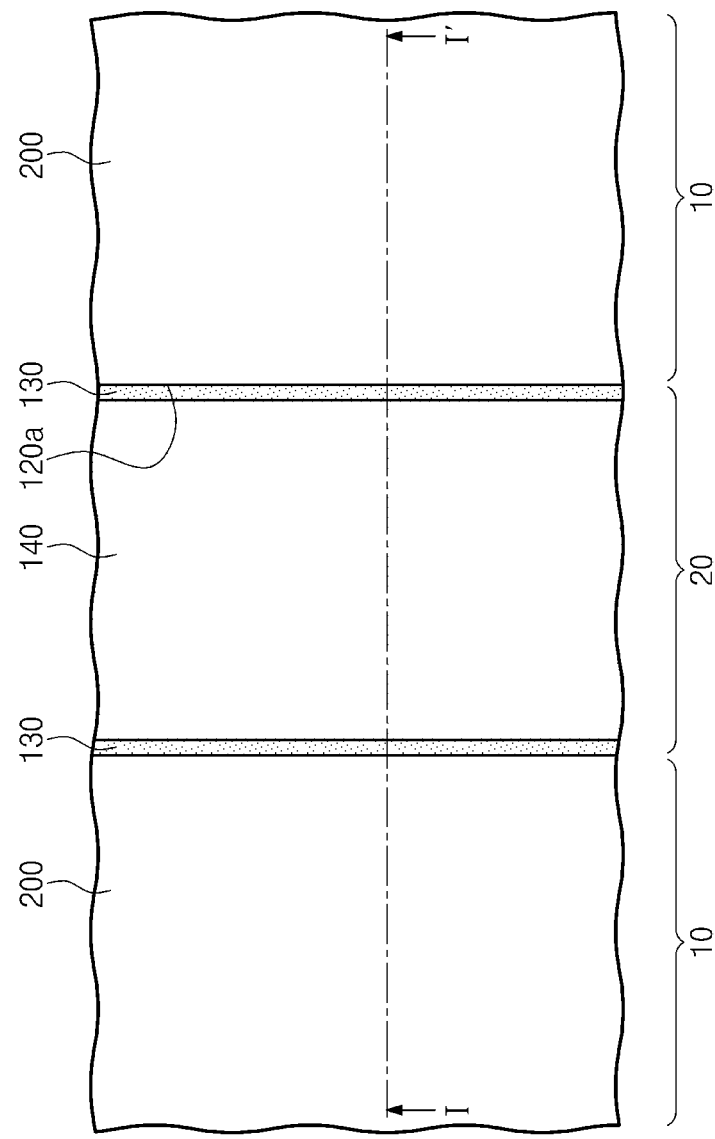
Figure 5B:
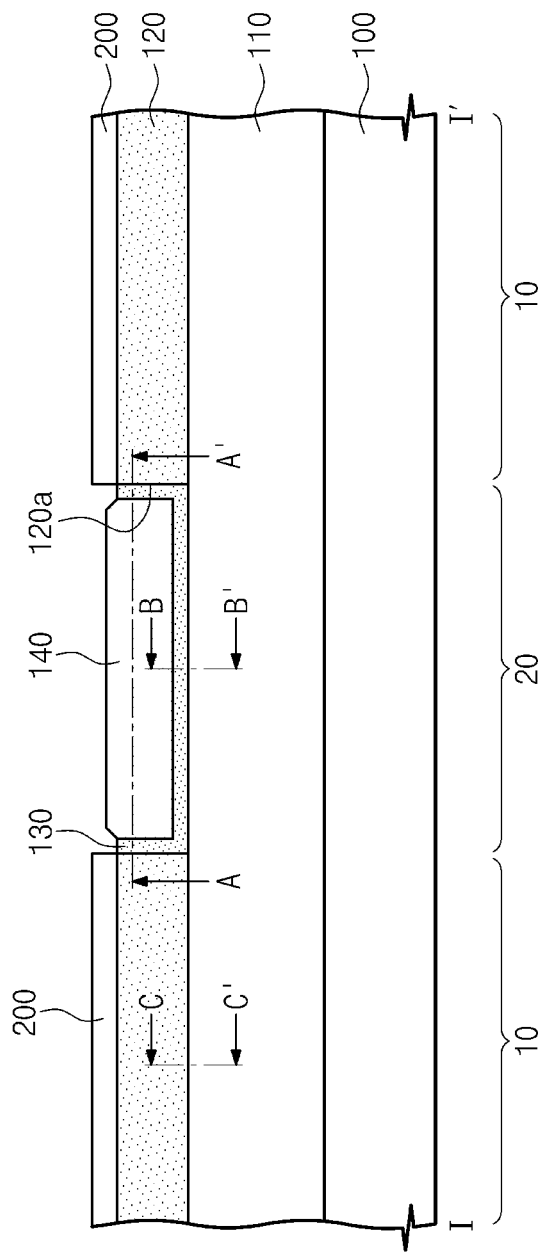

In some embodiments, the germanium concentration of the spacer layer 130 may be substantially equal to or greater than that of the upper portion of the buffer layer 110 and may be smaller than that of a second channel layer 140 of FIGS. 5A and 5B which will be formed on the spacer layer 130. For example, the spacer layer 130 may be formed of $Si_{1-z}Ge_z$ ($x \leq z < w$), and the germanium concentration of the spacer layer 130 may be in a range of about 10% to about 90%.

In an embodiment, the spacer layer 130 may have a uniform germanium concentration. For example, the germanium concentration of the spacer layer 130 may be substantially equal to that of the upper portion of the buffer layer 110. The difference in the germanium concentration between the spacer layer 130 and the first channel layer 120 may be substantially equal to or greater than the difference in the germanium concentration between the buffer layer 110 and the first channel layer 120.

In another embodiment, the germanium concentration in the spacer layer 130 may gradually increase as its thickness increases. The germanium concentration of the spacer layer 130 may be graded in a range of about 30% to about 60%. In other words, the spacer layer 130 may have a germanium concentration gradient. Since the lattice constant of germanium is greater than that of silicon, the lattice constant of the spacer layer 130 may increase as the distance from the sidewall of the first channel layer 120 increases.

Referring to FIGS. 1, 5A, and 5B, the second channel layer 140 may be formed in the opening 120a having the spacer layer 130 (S50).

In some embodiments, the second channel layer 140 may be formed of a semiconductor material that has the same lattice structure but has a lattice constant greater than that of the buffer layer 110. For example, the second channel layer 140 may be formed of a material that has a lattice constant greater than that of the buffer layer 110 and is selected from a group consisting of Ge, SiGe, and a III-V group compound semiconductor.

According to an embodiment, the lattice of the second channel layer 140 may be horizontally shrunken by a difference in the lattice constant between the second channel layer 140 and the buffer layer 110. In other words, the second channel layer 140 may have a compressive strain. For example, the second channel layer 140 may be formed of a material that has a lattice constant greater than that of the buffer layer 110 and is selected from a group consisting of SiGe, Ge, and a III-V group compound semiconductor.

The second channel layer 140 may be formed by an epitaxial growth process using the spacer layer 130 as a seed and may completely fill the opening 120a in which the spacer layer 130 is formed. The second channel layer 140 may protrude from the top surface of the first channel layer 120 by the epitaxial growth process.

In some embodiments, since the spacer layer 130 is formed at a boundary between the first channel layer 120 and the second channel layer 140, it is possible to reduce or minimize crystal defects (e.g., threading dislocations, stacking faults, twin boundaries, or anti-phase boundaries) that may be caused at an interface between the first and second channel layers 120 and 140 by a difference in the lattice constant between the first and second channel layers 120 and 140. For example, the crystal defects of the second channel layer 140 may be reduced to improve electrical characteristics of a metal-oxide-semiconductor (MOS) transistor to be formed on the second channel layer 140.

In an embodiment, the second channel layer 140 may be formed of a semiconductor material including germanium. The second channel layer 140 may be formed with germanium and silicon during the epitaxial growth process for forming the second channel layer 140. The second channel layer 140 may have a uniform germanium concentration. The germanium concentration of the second channel layer 140 may be greater than that of the buffer layer 110. For example, the second channel layer 140 may be formed of $Si_{1-w}Ge_w$ ($z < w \leq 1$). The germanium concentration of the second channel layer 140 may be in a range of about 60% to about 100%. The difference in the germanium concentration between the second channel layer 140 and the buffer layer 110 may be about 30% or more.

The mask pattern 200 covering the first channel layer 120 may be removed after the formation of the second channel layer 140. Subsequently, a planarization process may be performed on a top surface of the protruding portion of the second channel layer 140. The planarization process of the second channel layer 140 may be performed using a blanket anisotropic etching process and/or a chemical mechanical polishing (CMP) process. Thus, the top surface of the second channel layer 140 may be substantially coplanar with the top surface of the first channel layer 120.

Figure 6A:
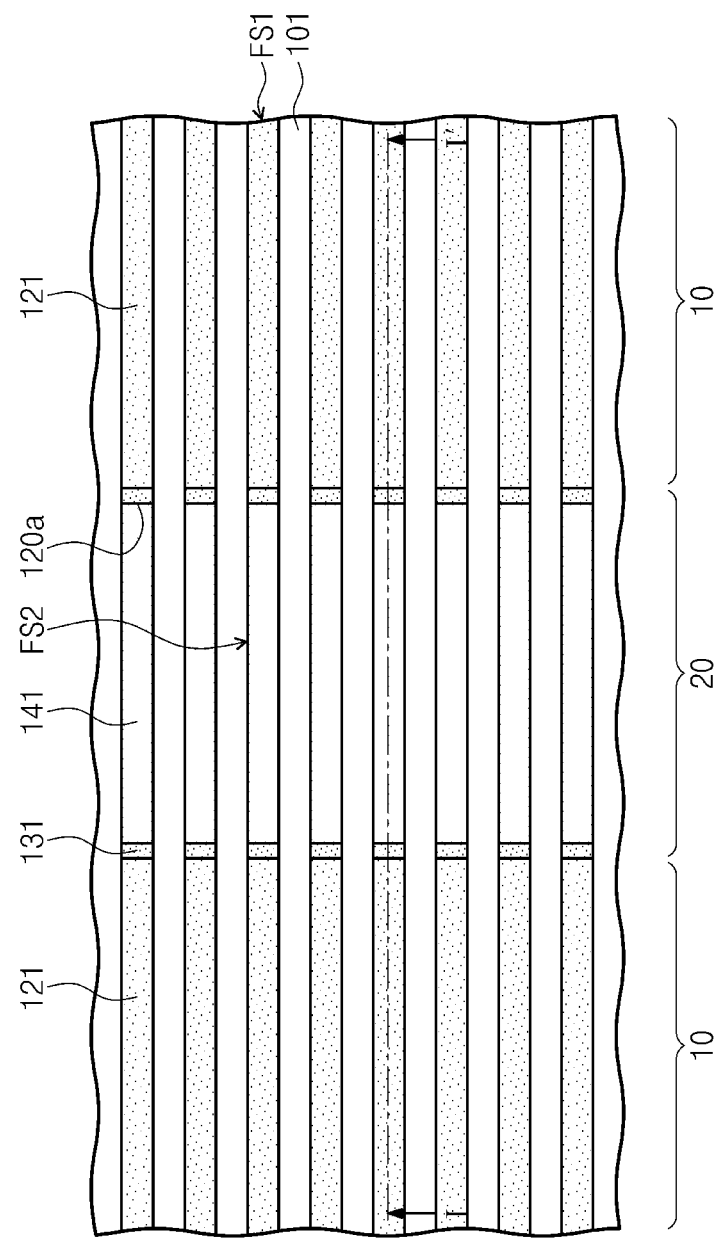
Figure 6B:
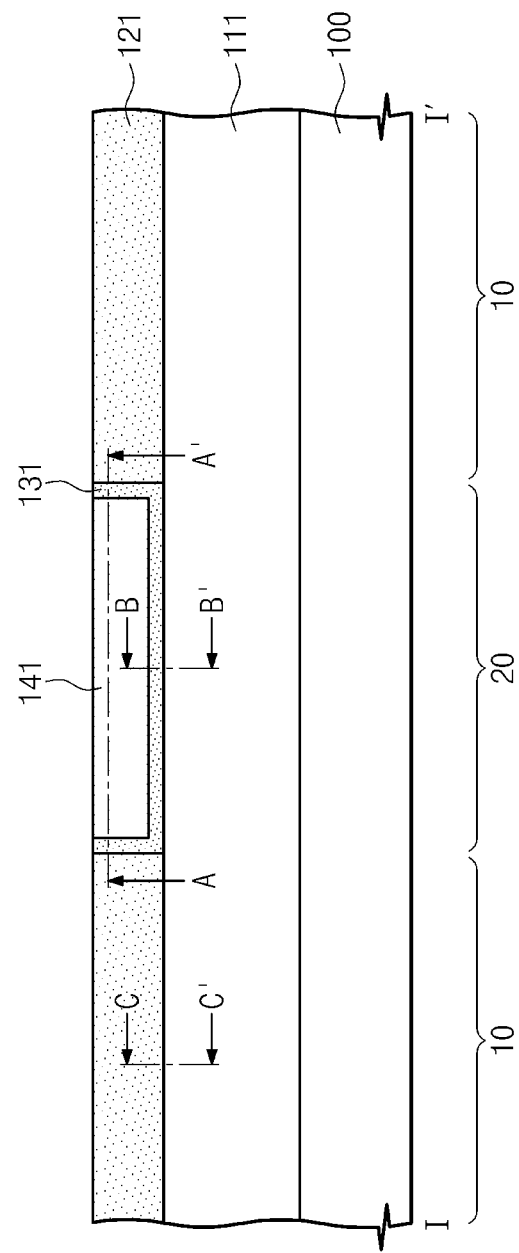

Referring to FIGS. 6A, 6B, and 8C, the first and second channel layers 120 and 140 and the buffer layer 110 may be patterned to form first and second fin structures FS1 and FS2 (S60).

For example, mask patterns (not shown) may be formed on the first and second channel layers 120 and 140. The first channel layer 120 and the buffer layer 110 of the first region 10 may be sequentially etched using the mask patterns as etch masks by an anisotropic etching process, and the second channel layer 140, the spacer layer 130 and the buffer layer 110 of the second region 20 may be sequentially etched using the mask patterns as etch masks by an anisotropic etching process. Thus, trenches may be formed to define the first and second fin structures FS1 and FS2. The trenches may have line shapes extending in one direction.

The first fin structures FS1 may be formed on the semiconductor substrate 100 of the first region 10, and the second fin structures FS2 may be formed on the semiconductor substrate 100 of the second region 20. Each of the first fin structures FS1 may include a buffer pattern 111 and a first channel pattern 121, and each of the second fin structures FS2 may include a buffer pattern 111, a spacer pattern 131, and a second channel pattern 141. The first fin structures FS1 may be arranged at equal distances in the first region 10, and the second fin structures FS2 may be arranged at equal distances in the second region 20.

According to an embodiment, a lower portion of the buffer layer 110 may remain when the first and second fin structures FS1 and FS2 are formed. Alternatively, the semiconductor substrate 100 may be exposed between the first fin structures FS1 and between the second fin structures FS2.

After the formation of the first and second fin structures FS1 and FS2, a filling insulation layer 101 may be formed to fill spaces between the first fin structures FS1 and spaces between the second fin structures FS2. The filling insulation layer 101 may be formed using a deposition technique with excellent step coverage. Thereafter, a planarization process may be performed on the filling insulation layer 101 until top surfaces of the first and second channel patterns 121 and 141 are exposed. The planarization process may be performed using an etch-back process or a chemical mechanical polishing (CMP) process.

In an embodiment, the filling insulation layer 101 may include at least one of $O_3$-tetra ethyl ortho silicate ($O_3$-TEOS), undoped silicate glass (USG), phosphosilicate glass (PSG), borosilicate glass (BSG), borophosphosilicate glass (BPSG), a high-density plasma (HDP) oxide, fluoride silicate glass (FSG), spin-on glass (SOG), or Tonen SilaZene (TOSZ).

Referring to FIG. 1, a first MOS (metal-oxide-semiconductor) transistor and a second MOS transistor may be formed in the first region 10 and the second region 20, respectively (S70).

Figure 7A:
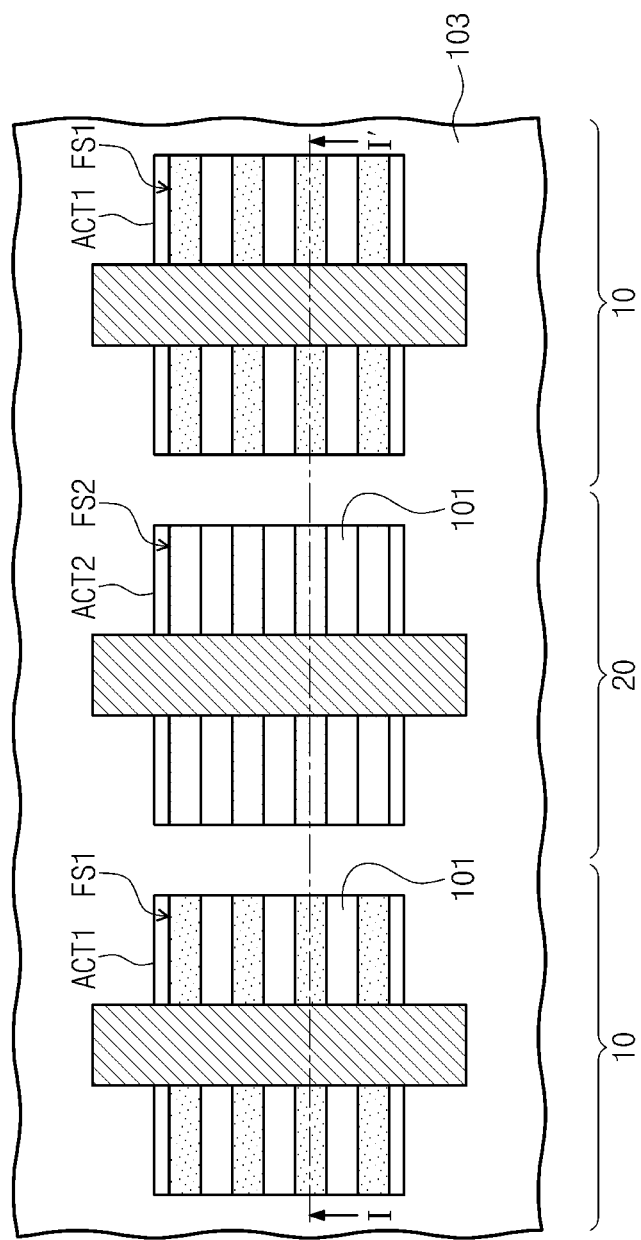
Figure 7B:
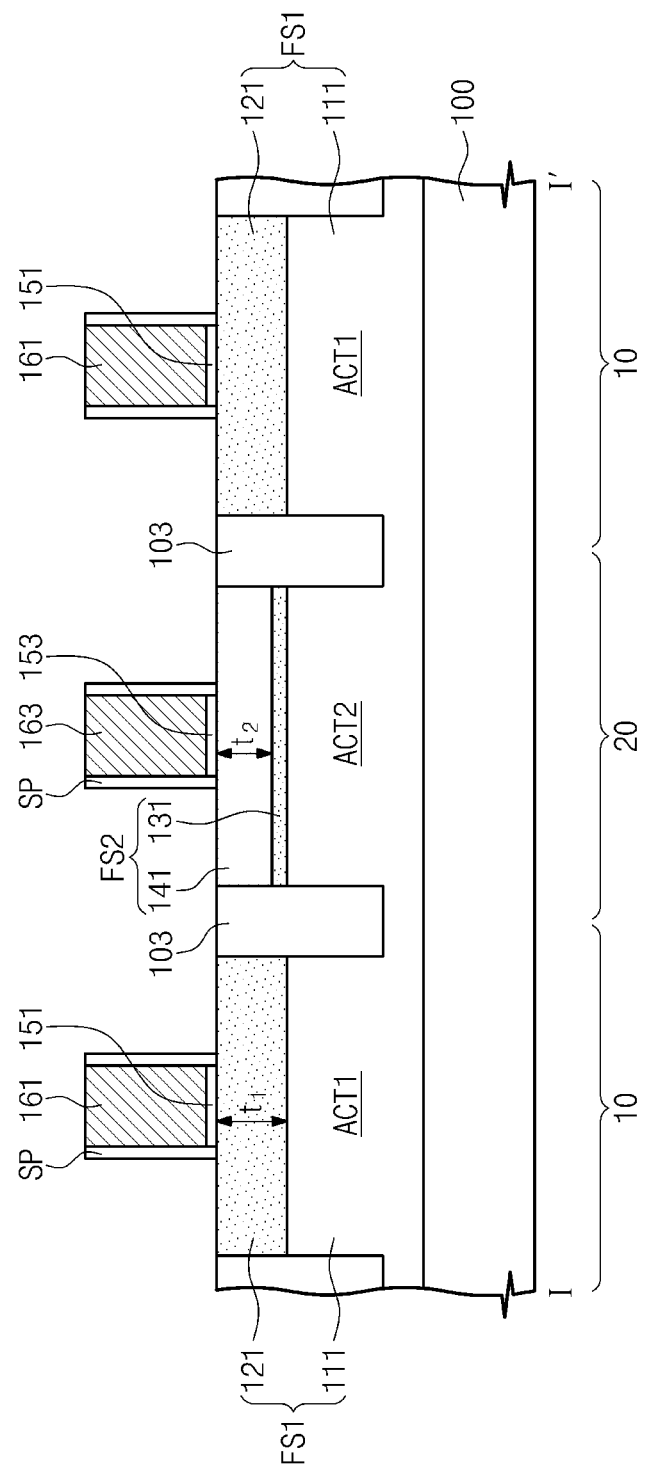

Referring to FIGS. 1, 7A, and 7B, a device isolation layer 103 may be formed to define a first active region ACT1 of the first region 10 and a second active region ACT2 of the second region 20. Forming the device isolation layer 103 may include forming a first mask pattern (not shown) covering portions of the first fin structures FS1 of the first region 10 and portions of the second fin structures FS2 of the second region 20, anisotropically etching portions of the first and second fin structures FS1 and FS2 and a portion of the filling insulation layer 101 using the mask pattern as an etch mask to form a trench, forming an insulating layer filling the trench, and planarizing the insulating layer until the first and second fin structures FS1 and FS2 are exposed. The device isolation layer 103 is formed as described above, so the first fin structures FS1 of the first region 10 may be separated from the second fin structures FS2 of the second region 20. When the trench for the formation of the device isolation layer 103 is formed, a portion of the spacer layer 130 between the first and second channel patterns 121 and 141 may be removed to form a spacer pattern 131 between a bottom surface of the second channel pattern 141 and a top surface of the buffer pattern 111. In an embodiment, a top surface of the second channel pattern 141 may be substantially coplanar with a top surface of the first channel pattern 121, and the bottom surface of the second channel pattern 141 may be higher than a bottom surface of the first channel pattern 121. For example, a thickness t2 of the second channel pattern 141 may be smaller than a thickness t1 of the first channel pattern 121.

In an embodiment, a top surface of the filling insulation layer 101 and a top surface of the device isolation layer 103 may be recessed after the formation of the device isolation layer 103, as illustrated in FIG. 8C. The top surfaces of the filling insulation layer 101 and the device isolation layer 103 may be selectively recessed by means of an etch recipe having an etch selectivity with respect to the first and second channel patterns 121 and 141. In an embodiment, the top surfaces of the filling insulation layer 101 and the device isolation layer 103 may be disposed at a vertical level between the top surface of the buffer pattern 111 and the top surfaces of the first and second channel patterns 121 and 141.

After the filling insulation layer 101 and the device isolation layer 103 are recessed to expose sidewalls of the first and second channel patterns 121 and 141, a first gate pattern 161 may be formed to cross over the first fin structures FS1 in the first region 10 and a second gate pattern 163 may be formed to cross over the second fin structures FS2, as illustrated in FIGS. 7A, 7B, and 8C. The first and second gate patterns 161 and 163 may correspond to gate electrodes. A first gate insulating layer 151 may be formed between the first gate pattern 161 and the first fin structures FS1. A second gate insulating layer 153 may be formed between the second gate pattern 163 and the second fin structures FS2.

In some embodiments, the first and second gate insulating layers 151 and 153 may include a high-k dielectric layer such as a hafnium oxide layer, a hafnium silicate layer, a zirconium oxide layer, or a zirconium silicate layer. The first and second gate insulating layers 151 and 153 may be formed using an atomic layer deposition technique. The first gate insulating layer 151 may conformally cover the sidewalls and the top surfaces of the first channel patterns 121, and the second gate insulating layer 153 may conformally cover the sidewalls and the top surfaces of the second channel patterns 141. In other embodiments, the first and second gate insulating layers 151 and 153 may be formed by thermally oxidizing surfaces of the first and second channel patterns 121 and 141.

Subsequently, gate spacers SP may be formed on both sidewalls of each of the first and second gate patterns 161 and 163. In some embodiments, a gate spacer layer may be formed to conformally cover the first and second gate patterns 161 and 163, and a blanket anisotropic etching process may be performed on the gate spacer layer to form the gate spacers SP.

Figure 8B:
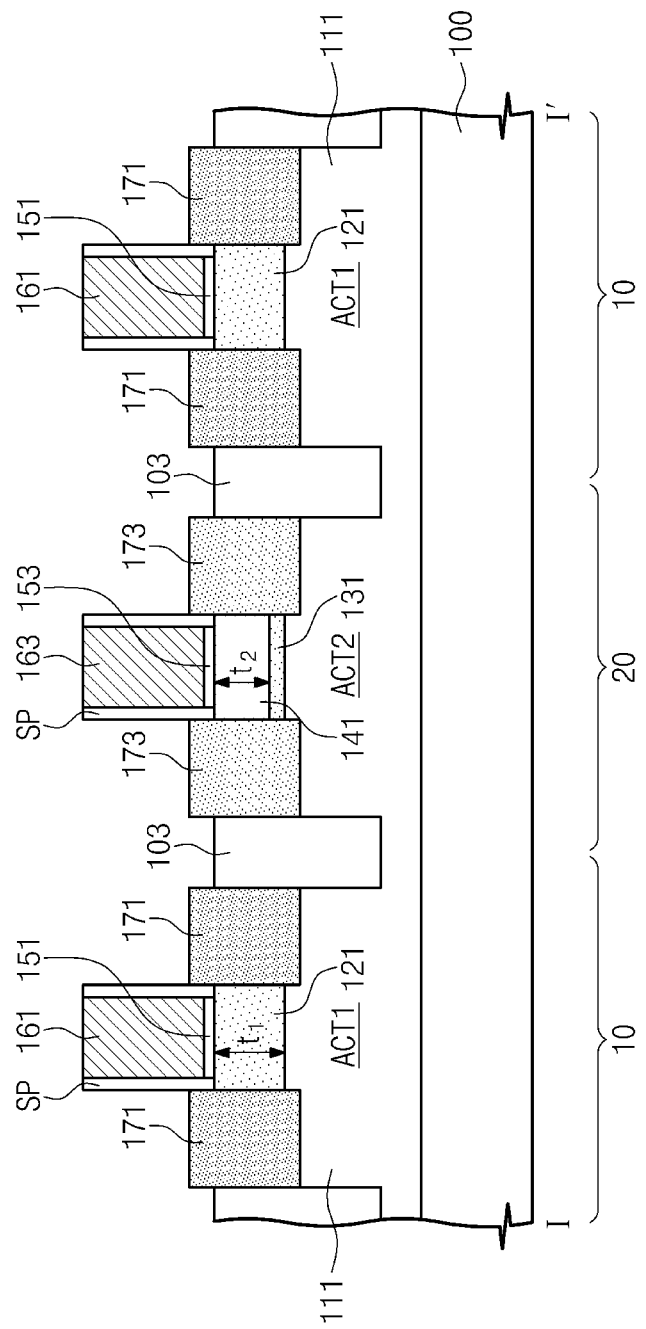
Figure 8C:
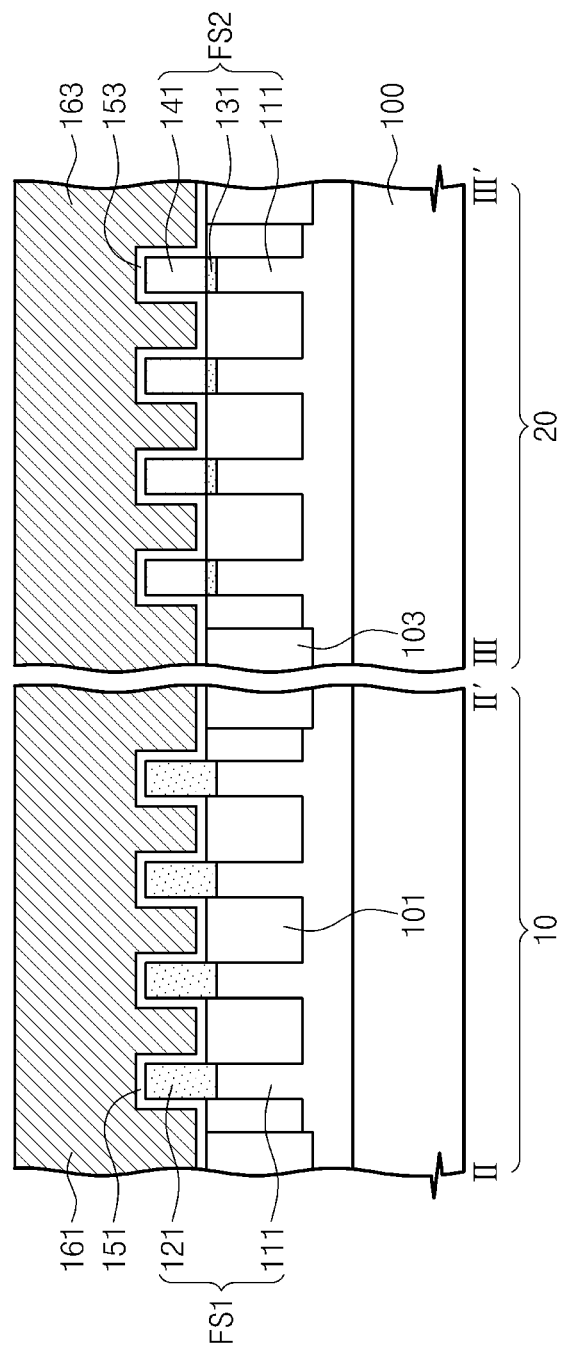
FIG. 8C is a cross-sectional view taken along lines II-II' and of FIG. 8A to illustrate a semiconductor device according to some embodiments of the inventive concepts.

Referring to FIGS. 8A, 8B, and 8C, after the formation of the first and second gate patterns 161 and 163, first source/drain patterns 171 may be formed at both sides (e.g., opposite sides) of the first gate pattern 161 and second source/drain patterns 173 may be formed at both sides (e.g., opposite sides) of the second gate pattern 163.

According to an embodiment, forming the first source/drain patterns 171 may include removing the first channel patterns 121 disposed at both sides of the first gate pattern 161 and forming epitaxial layers. The first source/drain patterns 171 may be formed of a material capable of providing a tensile strain to the first channel patterns 121. For example, the first source/drain patterns 171 may be formed of a material of which a lattice constant is smaller than that of the first channel patterns 121. For example, the first source/drain patterns 171 may be formed of silicon carbide (SiC). In an embodiment, a metal silicide (not shown) may be formed on each of the first source/drain patterns 171. For example, the metal silicide may be nickel silicide, cobalt silicide, tungsten silicide, titanium silicide, niobium silicide, or tantalum silicide.

Forming the second source/drain patterns 173 may include removing the second channel patterns 141 disposed at both sides of the second gate pattern 163 and forming epitaxial layers. The second source/drain patterns 173 may be formed of a material capable of providing a compressive strain to the second channel patterns 141. For example, the second source/drain patterns 173 may be formed of a material of which a lattice constant is greater than that of the second channel patterns 141. For example, the second source/drain patterns 173 may be formed of silicon-germanium (SiGe). In an embodiment, a metal silicide (not shown) may be formed on each of the second source/drain patterns 173. For example, the metal silicide on the second source/ drain pattern 173 may be nickel silicide, cobalt silicide, tungsten silicide, titanium silicide, niobium silicide, or tantalum silicide.

In other embodiments, forming the first and second source/drain patterns 171 and 173 may include implanting N-type or P-type dopant ions into the first and second channel patterns 121 and 141 by using the first and second gate patterns 161 and 163 as ion implantation masks. In some embodiments, the first source/drain patterns 171 may include N-type dopant ions and the second source/drain pattern patterns 173 may include P-type dopant ions.

According to an embodiment, the first and second gate patterns 161 and 163 may be replaced with first and second metal gate electrodes after the formation of the first and second source/drain patterns 171 and 173. For example, the first gate pattern 161 may be removed to define a first gate region between the gate spacers SP of the first region 10, and the second gate pattern 163 may be removed to define a second gate region between the gate spacers SP of the second region 20. Thereafter, a barrier metal layer (not shown) and a metal layer (not shown) may be sequentially formed in each of the first and second gate regions, so the first and second metal gate electrodes may be formed in the first and second gate regions, respectively. The barrier metal layer may be formed of a conductive material having a predetermined work function. For example, the barrier metal layer may be formed of a metal nitride layer such as a titanium nitride layer, a tantalum nitride layer, a tungsten nitride layer, a hafnium nitride layer, and/or a zirconium nitride layer. The metal layer may be formed of a conductive material of which a specific resistance is lower than that of the barrier metal layer. For example, the metal layer may include at least one of tungsten, copper, hafnium, zirconium, titanium, tantalum, aluminum, ruthenium, palladium, platinum, cobalt, nickel, or a conductive metal nitride.

Figure 9:
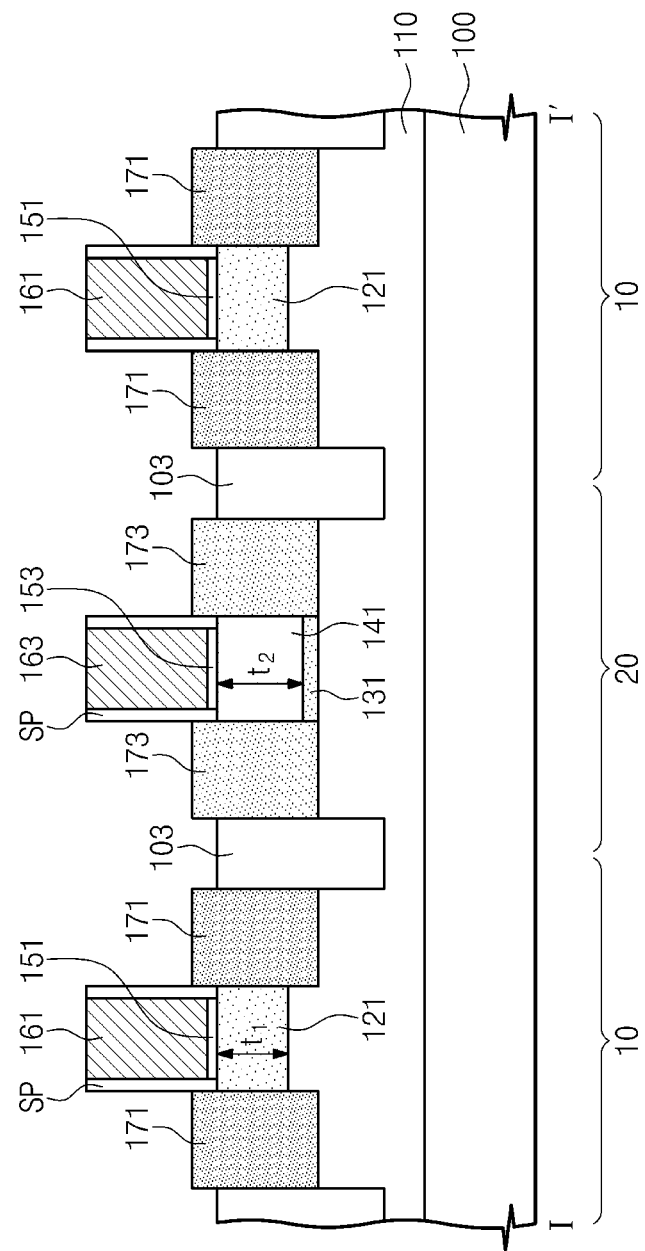
FIGS. 9 and 10 are cross-sectional views taken along line I-I' of FIG. 8A to illustrate semiconductor devices according to some embodiments of the inventive concepts.
Figure 10:
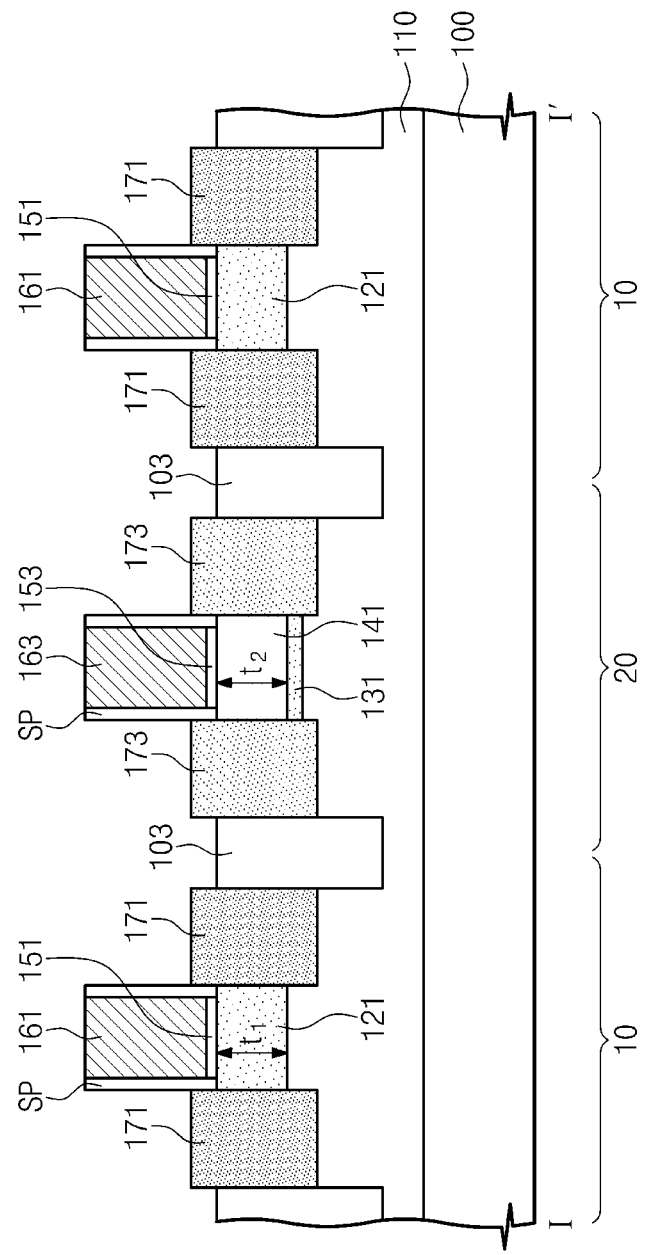
Figure 11:
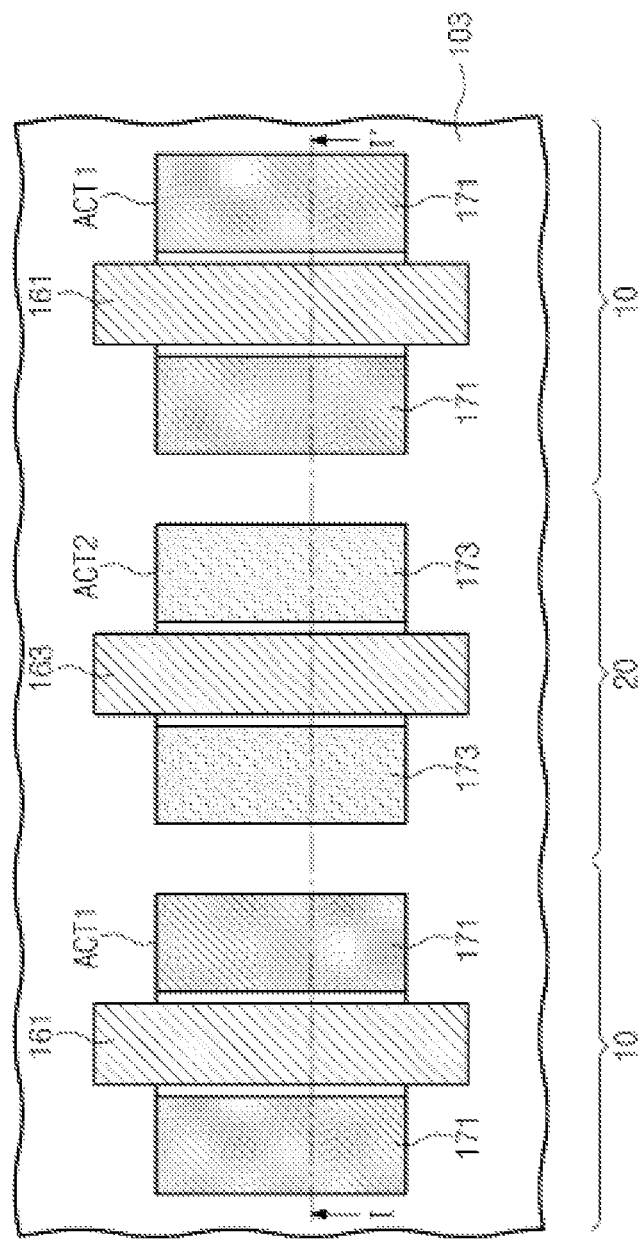
FIG. 11 is a plan view illustrating a semiconductor device according to some embodiments of the inventive concepts.

FIGS. 9 and 10 are cross-sectional views taken along line I-I' of FIG. 8A to illustrate semiconductor devices according to other embodiments of the inventive concepts. FIG. 11 is a plan view illustrating a semiconductor device according to still other embodiments of the inventive concepts. In the present embodiment, the descriptions of the same technical features as those mentioned in the embodiment with reference to FIGS. 2A to 8A, 2B to 8B, and 8C will be omitted or mentioned briefly for the purpose of ease and convenience in explanation.

According to embodiments illustrated in FIGS. 9 and 10, when the opening 120a of FIG. 3B is formed, the top surface of the buffer layer 110 of the second region 20 may be recessed to be lower than a top surface of the buffer layer 110 of the first region 10. For example, in FIG. 3B, a depth of the opening 120a may be greater than a thickness of the first channel layer 120. In this case, a thickness t2 of the second channel layer 140 formed in the opening 120a may be greater than or substantially equal to the thickness t1 of the first channel layer 120. Here, the top surfaces of the first and second channel layers 120 and 140 may be substantially coplanar with each other.

According to an embodiment illustrated in FIG. 11, the process of forming the first and second fin structures FS1 and FS2 described with reference to FIGS. 5A and 5B may be omitted. In this case, after the planarization process is performed on the second channel layer 140 as described with reference to FIGS. 5A and 5B, a device isolation layer 130 may be formed to define a first active region ACT1 and a second active region ACT2 in the first region 10 and the second region 20, respectively, as illustrated in FIG. 11. In the present embodiment, forming the device isolation layer 103 may include forming a mask pattern (not shown) on the first and second channel layers 120 and 140, anisotropically etching the first and second channel layers 120 and 140 and the buffer layer 110 using the mask pattern as an etch mask to form a device isolation trench, and filling the device isolation trench with an insulating layer. By the formation of the device isolation layer 103, a first channel pattern 121 may be formed in the first region 10 and a second channel pattern 141 may be formed in the second region 20. Thereafter, first and second gate patterns 161 and 163 may be formed on the first and second channel patterns 121 and 141, respectively, as described with reference to FIG. 7B. Next, as described with reference to FIG. 8B, first source/drain patterns 171 may be formed on or in the first active region ACT1 at both sides of the first gate pattern 161 and second source/drain patterns 173 may be formed on or in the second active region ACT2 at both sides of the second gate pattern 163.

Figure 12A:
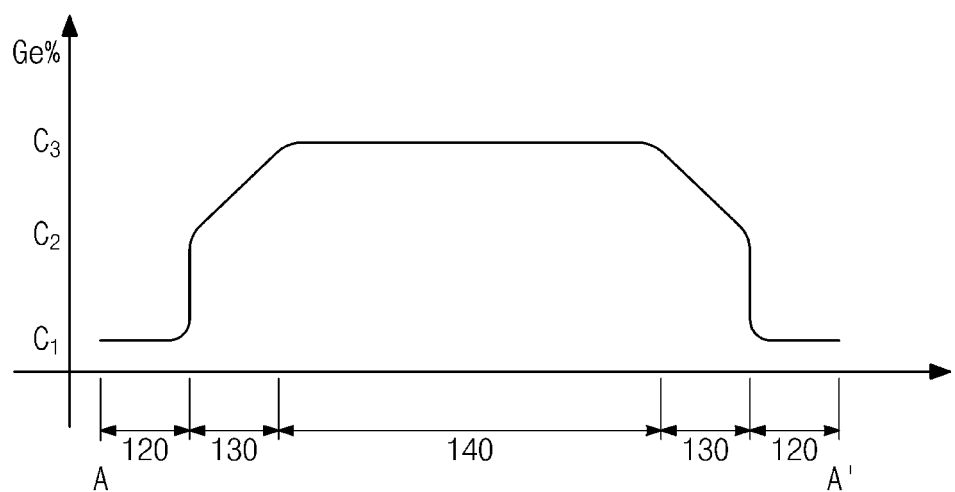
FIGS. 12A, 12B, and 12C are graphs illustrating profiles of germanium concentrations corresponding to lines A-A', B-B', and C-C' of FIG. 5B to explain germanium concentrations of portions of a semiconductor device according to some embodiments of the inventive concepts.
Figure 12B:
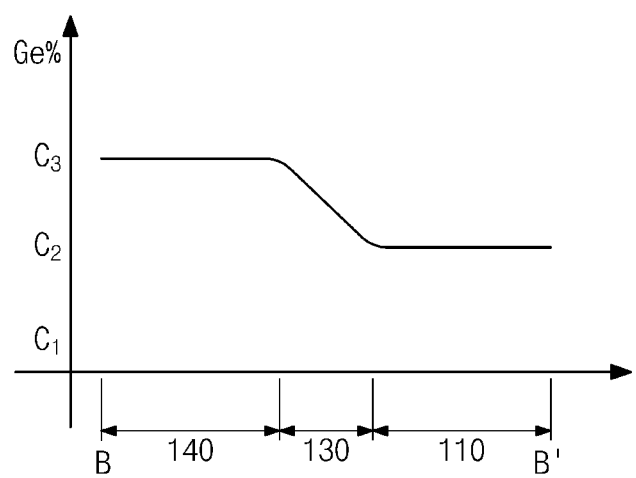
Figure 12C:
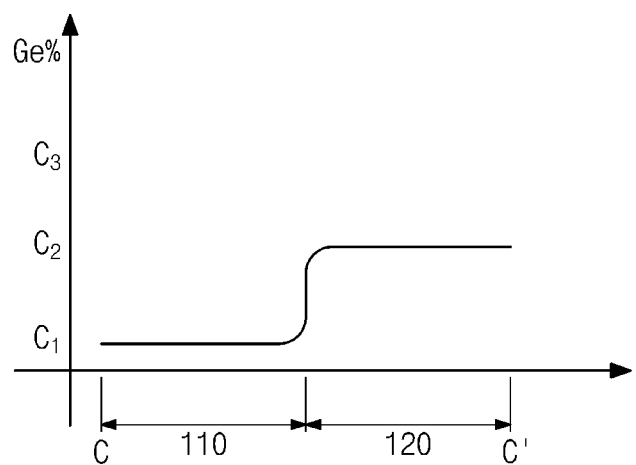

According to an embodiment, the first and second source/drain patterns 171 and 173 may be epitaxial patterns that are formed using a selective epitaxial growth process. A lattice constant of the first source/drain patterns 171 may be different from that of the second source/drain patterns 173. For example, the first source/drain patterns 171 may be formed of a semiconductor material providing a tensile strain to the first channel pattern 121, and the second source/drain patterns 173 may be formed of a semiconductor material providing a compressive strain to the second channel pattern 141. According to another embodiment, each of the first and second source/drain patterns 171 and 173 may be formed by implanting N-type or P-type dopant ions into each of the first and second active regions ACT1 and ACT2 at both sides of each of the first and second gate patterns 161 and 163. In some embodiments, the first source/drain patterns 171 may include N-type dopant ions and the second source/drain pattern patterns 173 may include P-type dopant ions. FIGS. 12A, 12B, and 12C are graphs illustrating profiles of germanium concentrations corresponding to lines A-A', B-B', and C-C' of FIG. 5B to explain germanium concentrations of portions of a semiconductor device according to some embodiments of the inventive concepts.

According to embodiments of the inventive concepts, the buffer layer 110, the first channel layer 120, the second channel layer 140, and the spacer layer 130 may be formed of the semiconductor materials including germanium (Ge).

As illustrated in FIGS. 12A, 12B, and 12C, the first channel layer 120 may have a first germanium concentration $C_1$, and the upper portion of the buffer layer 110 adjacent to the first channel layer 120 may have a second germanium concentration $C_2$. The second channel layer 140 may have a third germanium concentration $C_3$ greater than the second germanium concentration $C_2$. The spacer layer 130 may be disposed between the first channel layer 120 and the second channel layer 140 and between the buffer layer 110 and the second channel layer 140. The spacer layer 130 may have the germanium concentration gradient. In an embodiment, the germanium concentration of the spacer layer 130 may continuously increase from the second germanium concentration $C_2$ to the third germanium concentration $C_3$ as the distance from the first channel layer 120 increases. For example, the spacer layer 130 may be formed by performing the selective epitaxial growth process while continuously increasing the concentration of germanium.

According to an embodiment, the germanium concentration difference ($C_3 \times C_2$) between the first channel layer 120 and the second channel layer 140 may be greater than the germanium concentration difference ($C_2 \times C_1$) between the buffer layer 110 and the first channel layer 120. Since the spacer layer 130 having the gradually increasing germanium concentration is formed between the first channel layer 120 and the second channel layer 140, the germanium concentration difference may be reduced at a boundary between the first channel layer 120 and the spacer layer 130 and at a boundary between the second channel layer 140 and the spacer layer 130. As a result, crystal defects between the first and second channel layers 120 and 140 may be reduced, so it is possible to reduce a leakage current of the second MOS transistor realized on the second channel layer 140.

As used herein, a germanium concentration may refer to an average concentration value of a bulk layer unless the context indicates otherwise. For example, the germanium concentration of a layer may refer to the average germanium concentration of the layer. In another example, a germanium concentration may not refer to an average germanium concentration of a bulk when the context indicates that the germanium concentration is gradient or that the germanium concentration is that of a small area. For example, the germanium concentration at a boundary of a first and a second layers may refer to a germanium concentration of a sectional area. The germanium concentration of the sectional area may refer to an average germanium concentration of a particular sectional area.

FIGS. 13A to 16A are graphs illustrating profiles of germanium concentrations corresponding to line A-A' of FIG. 5B to explain germanium concentrations of portions of semiconductor devices according to various embodiments of the inventive concepts. FIGS. 13B to 16B are graphs illustrating profiles of germanium concentrations corresponding to line B-B' of FIG. 5B to explain germanium concentrations of portions of semiconductor devices according to various embodiments of the inventive concepts.

According to embodiments of the inventive concepts, the buffer layer 110, the first channel layer 120, the second channel layer 140, and the spacer layer 130 may be formed of semiconductor materials including germanium (Ge). The semiconductor materials including germanium may be one or more of aforementioned semiconductor materials. Here, the first channel layer 120 may have a first germanium concentration $C_1$, and the upper portion of the buffer layer 110 adjacent to the first channel layer 120 may have a second germanium concentration $C_2$. The second channel layer 140 may have a third germanium concentration $C_3$ greater than the second germanium concentration $C_2$.

Figure 13A:
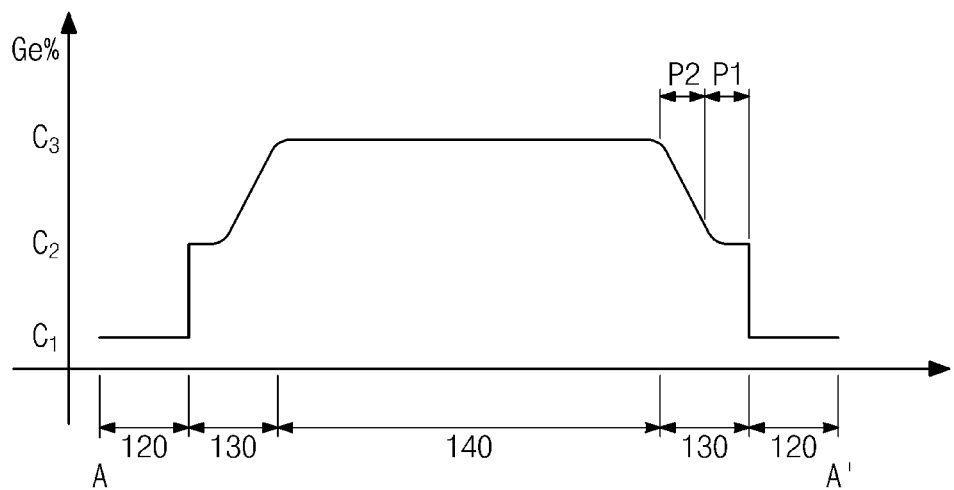
Figure 13B:
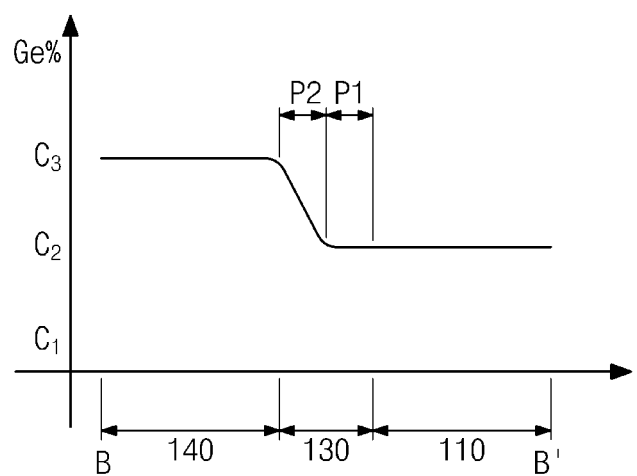

According to an embodiment illustrated in FIGS. 13A and 13B, the spacer layer 130 may include a first portion P1 being in contact with the buffer layer 110 and the first channel layer 120 and a second portion P2 being in contact with the bottom surface and the sidewall of the second channel layer 140. Here, the first portion P1 may have a second germanium concentration $C_2$ that is uniform, and the second portion P2 may have a germanium concentration gradient.

Figure 14A:
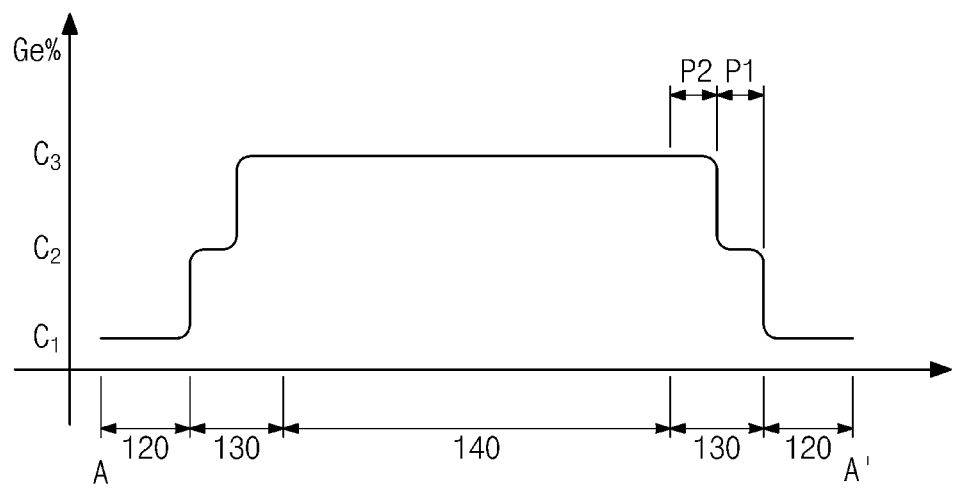
Figure 14B:
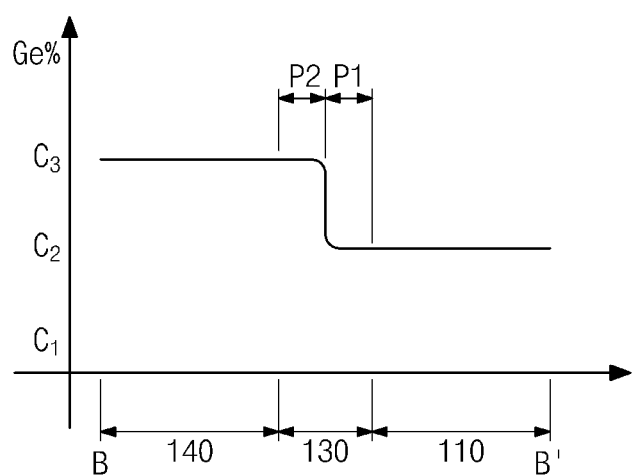

According to an embodiment illustrated in FIGS. 14A and 14B, the spacer layer 130 may include a first portion P1 being in contact with the buffer layer 110 and the first channel layer 120 and a second portion P2 being in contact with the bottom surface and the sidewall of the second channel layer 140. Here, the first portion P1 may have the second germanium concentration $C_2$ that is substantially uniform through the thickness of the portion P1, and the second portion P2 may have the third germanium concentration $C_3$ that is substantially uniform through the thickness of the portion P2. In the embodiment of FIG. 14A, the changes in germanium concentration have a substantially step-wise profile.

Figure 15A:
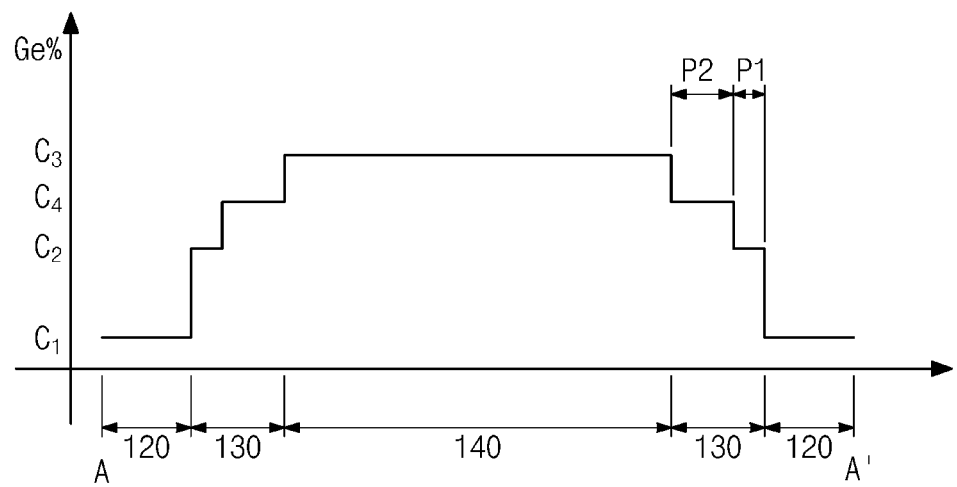
Figure 15B:
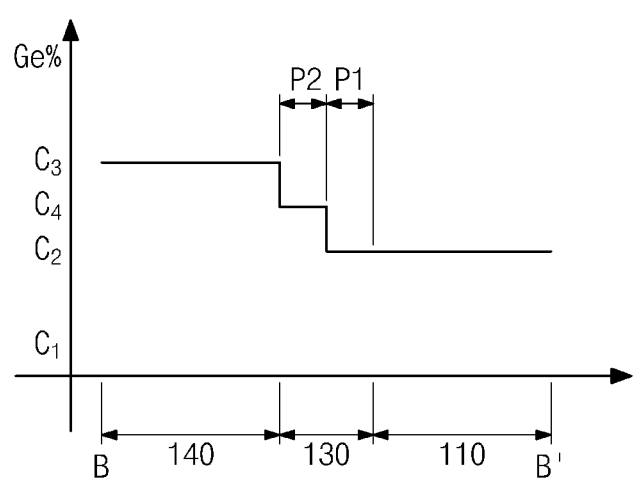

According to an embodiment illustrated in FIGS. 15A and 15B, the spacer layer 130 may include a first portion P1 being in contact with the buffer layer 110 and a second portion P2 being in contact with the second channel layer 140. Here, the first portion P1 may have the second germanium concentration $C_2$ which is substantially uniform through the thickness of the portion P1, and the second portion P2 may have a fourth germanium concentration $C_4$ which is also substantially uniform through the thickness of portion P2 and which is smaller than the third germanium concentration $C_3$.

According to an embodiment, the germanium concentrations C1, C2, C3, and C4 may be made by the selective epitaxial growth process. The period for forming the second germanium concentration $C_2$ may be different from the period for forming the fourth germanium concentration $C_4$ which are performed during the selective epitaxial growth process for forming the spacer layer 130. For example, the time for forming the fourth germanium concentration $C_4$ may be longer than the time for forming the second germanium concentration $C_2$, and thus, the second portion P2 of the spacer layer 130 may be thicker than the first portion P1 of the spacer layer 130. In the embodiment of FIGS. 15A and 15B, the changes in germanium concentration also have a substantially step-wise profile.

Figure 16A:
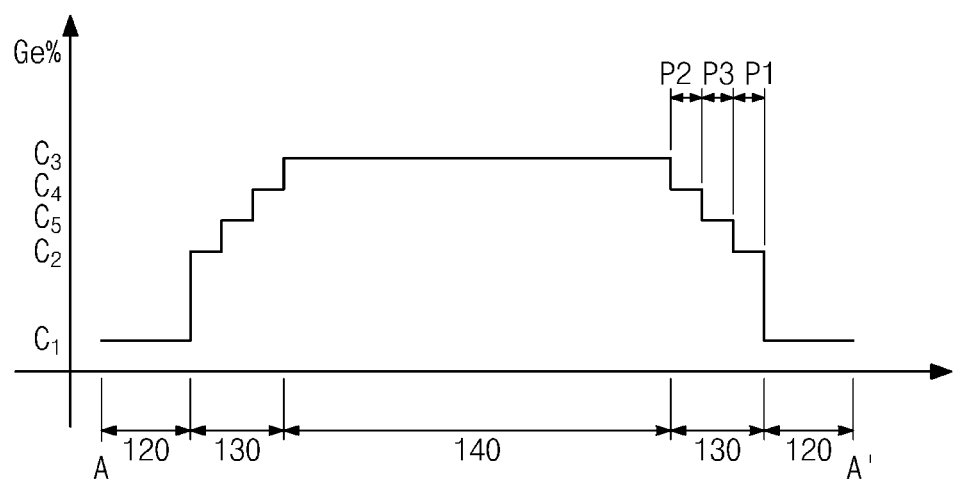
Figure 16B:
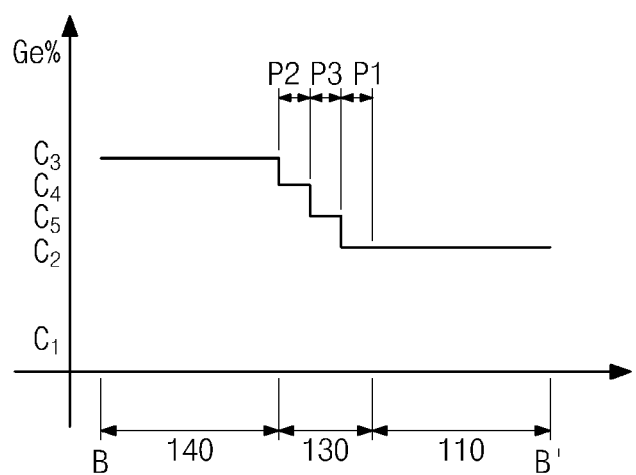

Referring to FIGS. 16A and 16B, a germanium concentration of the spacer layer 130 may monotonically increase from the second germanium concentration $C_2$ to the third germanium concentration $C_3$ during the selective epitaxial growth process for forming the spacer layer 130. For example, the germanium concentration of the spacer layer 130 may discontinuously increase, or abruptly increase, for example, in a step-wise manner. In an embodiment, the spacer layer 130 may include a first portion P1 being in contact with the buffer layer 110 and the first channel layer 120, a second portion P2 being in contact with the second channel layer 140, and a third portion P3 disposed between the first portion P1 and the second portion P2. Here, the first portion P1 may have the second germanium concentration $C_2$, and the second portion P2 may have the fourth germanium concentration $C_4$ smaller than the third germanium concentration $C_3$. The third portion P3 may have a fifth germanium concentration $C_5$ that is greater than the second germanium concentration $C_2$ and is smaller than the fourth germanium concentration $C_4$. The germanium concentration of each of the first to third portions P1, P2, and P3 may be substantially uniform without a concentration gradient through the thicknesses of respective portions.

As used herein, a gradient germanium concentration may refer to a changing germanium concentration according to position change. The gradient germanium concentration does not only refer to a continuously varying profile of a germanium concentration but also may refer to a discontinuously varying profile of a germanium concentration. For example, the embodiments shown in FIGS. 12 through 16 show various kinds of gradient germanium concentration examples.

FIGS. 14A and 14B show rounded shape of stepwise profile and FIGS. 15A, 15B, 16A, and 16B show sharp stepwise profile. The former embodiments may have a smoother concentration change of germanium than the latter embodiments have. In another example, the embodiments shown in FIGS. 15A through 16B may also have a rounded stepwise profile in a microscopic viewpoint. Likewise, the embodiments shown in FIGS. 14A and 14B may have a sharp stepwise profile in a macroscopic viewpoint. In one example, a device formed by a sharp stepwise profile process may have a rounded profile in the device by a typical manufacturing process.

Figure 17:
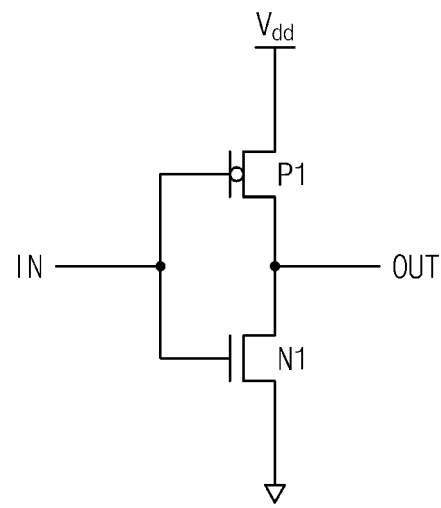
FIG. 17 is a circuit diagram illustrating an inverter included in a semiconductor device according to embodiments of the inventive concepts.

FIG. 17 is a circuit diagram illustrating an inverter included in a semiconductor device according to embodiments of the inventive concepts.

Referring to FIG. 17, a complementary metal-oxide-semiconductor (CMOS) inverter may consist of a PMOS transistor P1 and an NMOS transistor N1. PMOS and NMOS transistors P1 and N1 may be connected in series to each other between a driving voltage $V_{dd}$ and a ground voltage (Vss). An input signal IN may be inputted in common to gates of the PMOS and NMOS transistors P1 and N1. An output signal OUT may be outputted in common from drains of the PMOS and NMOS transistors P1 and N1. The driving voltage $V_{dd}$ may be applied to a source of the PMOS transistor P1, and the ground voltage (Vss) may be applied to a source of the NMOS transistor N1. The CMOS inverter may invert the input signal IN to output the output signal OUT. For example, if a logic level '1' is inputted as an input signal IN of the inverter, a logic level '0' is outputted as an output signal OUT. If a logic level '0' is inputted as an input signal In of the inverter, a logic level '1' is outputted as an output signal OUT. At least one of the PMOS and NMOS transistors P1 and N1 may correspond to a transistor described in the aforementioned embodiments.

Figure 18:
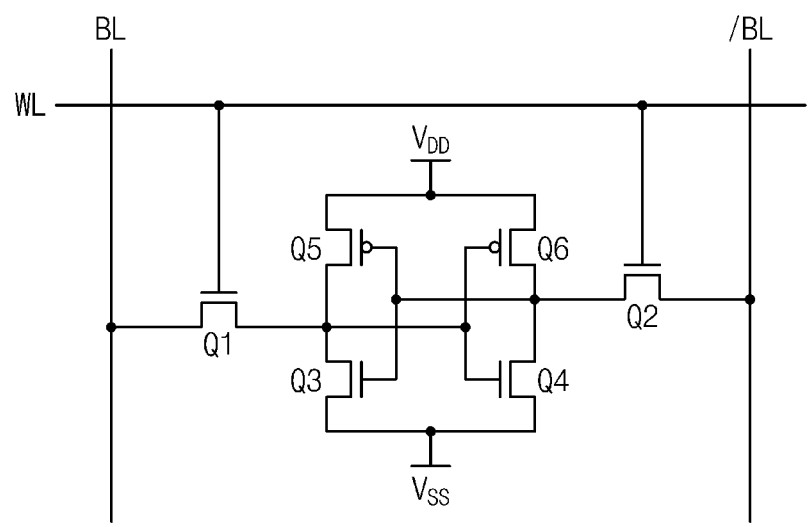
FIG. 18 is a circuit diagram illustrating a static random access memory (SRAM) cell included in a semiconductor device according to embodiments of the inventive concepts.

FIG. 18 is a circuit diagram illustrating a static random access memory (SRAM) cell included in a semiconductor device according to an embodiment of the inventive concepts.

Referring to FIG. 18, an SRAM cell may include first and second access transistors Q1 and Q2, first and second driver transistors Q3 and Q4, and first and second load transistors Q5 and Q6. Sources of the first and second driver transistors Q3 and Q4 may be connected to a ground line $V_{SS}$, and sources of the first and second load transistors Q5 and Q6 may be connected to a power line $V_{DD}$. At least one of the transistors Q1, Q2, Q3, Q4, Q5, and Q6 may correspond to a transistor described in the aforementioned embodiments.

The first driver transistor Q3 corresponding to an NMOS transistor and the first load transistor Q5 corresponding to a PMOS transistor may constitute a first inverter, and the second driver transistor Q4 corresponding to an NMOS transistor and the second load transistor Q6 corresponding to a PMOS transistor may constitute a second inverter.

Output terminals of the first and second inverters are connected to a source of the first access transistor Q1 and a source of the second access transistor Q2, respectively. In addition, the output terminal of the first inverter may be connected to an input terminal of the second inverter and the output terminal of the second inverter may be connected to an input terminal of the first inverter, so the first and second inverters may constitute one latch circuit. Drains of the first and second access transistors Q1 and Q2 are connected to first and second bit lines BL and /BL, respectively.

Figure 19:
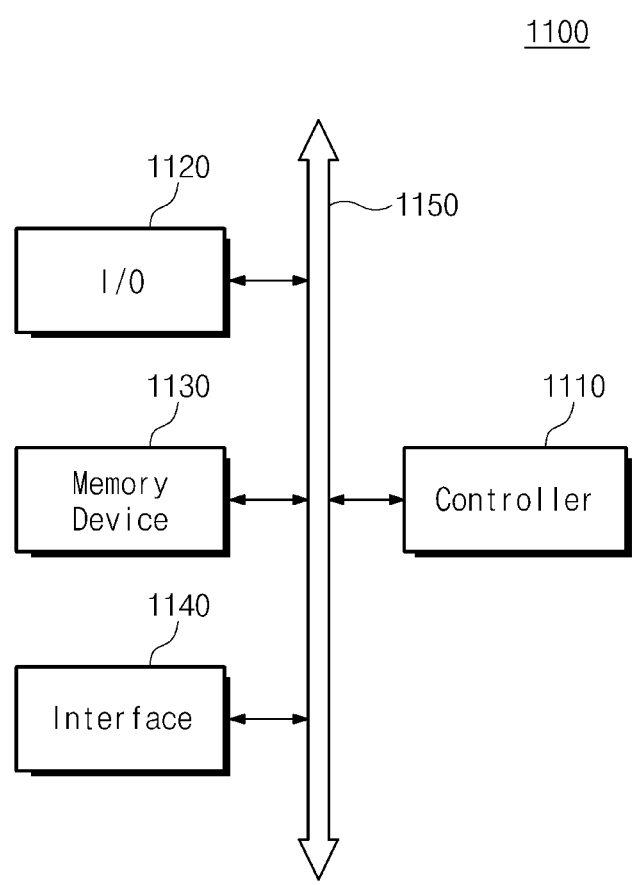
FIG. 19 is a schematic block diagram illustrating an electronic system including a semiconductor device according to embodiments of the inventive concepts.

FIG. 19 is a schematic block diagram illustrating an electronic system including a semiconductor device according to embodiments of the inventive concepts.

An electronic system including a semiconductor device according to aforementioned embodiments may be applied to an electronic device such as a personal digital assistant (PDA), a portable computer, a web tablet, a wireless phone, a mobile phone, a digital music player, a memory card, or other electronic products which may receive and/or transmit information data by wireless.

Referring to FIG. 19, an electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. At least one of the semiconductor devices according to the embodiments described above may be applied to the controller 1110, the I/O unit 1120, the memory device 1130, and/or the interface unit 1140.

The controller 1110 may include at least one of a microprocessor, a digital signal processor, a microcontroller, or another logic device having a similar function to any one thereof. The I/O unit 1120 may include a keypad, a keyboard and/or a display device.

The memory device 1130 may store data and/or commands. The interface unit 1140 may transmit electrical data to a communication network or may receive electrical data from a communication network.

The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

According to some embodiments of the inventive concepts, the spacer layer having a gradually increasing lattice constant may be formed between the first and second channel layers having different lattice constants, so it is possible to reduce the crystal defects caused by the lattice constant difference between the first and second channel layers. For example, the leakage current of the MOS transistor realized on the second channel layer may be reduced.

In addition, the channel layers of NMOS and PMOS transistors may be formed on the same buffer layer, and thus, the semiconductor device may be easily fabricated.

While aspects of the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A semiconductor device comprising:
   a semiconductor substrate including first and second regions;
   a buffer layer formed on the semiconductor substrate in the first and second regions;
   a first channel layer formed on the buffer layer of the first region;
   a second channel layer formed on the buffer layer of the second region; and
   a spacer layer disposed between the second channel layer and the buffer layer,
   wherein the buffer layer, the first and second channel layers, and the spacer layer are formed of semiconductor materials including germanium (Ge),
   a germanium concentration difference between the first channel layer and the second channel layer is greater than a germanium concentration difference between the buffer layer and the second channel layer, and the spacer layer has a germanium concentration gradient.

2. The semiconductor device of claim 1, wherein the buffer layer has a first germanium concentration, the second channel layer has a second germanium concentration greater than the first germanium concentration, and the germanium concentration of the spacer layer has a graded profile such that a region adjacent to a bottom surface of the spacer layer has a first germanium concentration and a region adjacent to a top surface of the spacer layer has a second germanium concentration greater than the first germanium concentration.

3. The semiconductor device of claim 1, wherein a top surface of the second channel layer is coplanar with a top surface of the first channel layer, and a thickness of the second channel layer is smaller than a thickness of the first channel layer.

4. The semiconductor device of claim 1, wherein a top surface of the second channel layer is coplanar with a top surface of the first channel layer, and a thickness of the second channel layer is substantially equal to or greater than a thickness of the first channel layer.

5. The semiconductor device of claim 1, wherein the germanium concentration of the spacer layer has a discontinuously varied profile.

6. The semiconductor device of claim 1, wherein the germanium concentration of the spacer layer has a continuously varied profile.

7. The semiconductor device of claim 1, wherein the spacer layer comprises: a first portion being in contact with the buffer layer and having a uniform germanium concentration; and a second portion being in contact with the second channel layer and having the germanium concentration gradient.

8. The semiconductor device of claim 1, wherein:
the spacer layer comprises: a first portion being in contact with the buffer layer; a second portion being in contact with the second channel layer; and a third portion between the first portion and the second portion, each of the first to third portions has a uniform germanium concentration, and the germanium concentration of the third portion is greater than the germanium concentration of the first portion and smaller than the germanium concentration of the second portion.

9. The semiconductor device of claim 1, wherein:
the buffer layer is formed of $Si_{1-x}Ge_x$ (0<x<1),
the first channel layer is formed of $Si_{1-y}Ge_y$ (0≤y<x),
the second channel layer is formed of $Si_{1-z}Ge_z$ (x<z≤1), and
the spacer layer is formed of $Si_{1-w}Ge_w$ (x≤w<z).

10. The semiconductor device of claim 1, further comprising:
a first gate electrode formed on the first channel layer;
first source/drain patterns disposed at opposite sides of the first gate electrode;
a second gate electrode formed on the second channel layer; and
second source/drain patterns disposed at opposite sides of the second gate electrode,
wherein the first source/drain patterns are formed of a semiconductor material of which a lattice constant is different from that of the second source/drain patterns.

11. A semiconductor device comprising:
a semiconductor substrate including first and second regions;
a buffer layer formed on the semiconductor substrate, the buffer layer having a lattice constant different from that of the semiconductor substrate;
a first channel layer formed on the buffer layer of the first region, the first channel layer having a lattice constant smaller than the lattice constant of the buffer layer;
a second channel layer formed on the buffer layer of the second region, the second channel layer having a lattice constant greater than the lattice constant of the buffer layer; and
a spacer layer disposed between the second channel layer and the buffer layer, the spacer layer having a lattice constant that gradually increases from a top surface of the buffer layer toward a bottom surface of the second channel layer,
wherein top surfaces of the first and second channel layers are coplanar with each other, and
a bottom surface of the spacer layer is disposed at substantially the same level as or a lower level than a bottom surface of the first channel layer.

12. The semiconductor device of claim 11, wherein the buffer layer, the first and second channel layers, and the spacer layer are formed of semiconductor materials including germanium (Ge),
a germanium concentration difference between the first channel layer and the second channel layer is greater than a germanium concentration difference between the buffer layer and the second channel layer, and
the spacer layer has a germanium concentration gradient.

13. The semiconductor device of claim 12, wherein:
the buffer layer is formed of $Si_{1-x}Ge_x$ (0<x<1),
the first channel layer is formed of $Si_{1-y}Ge_y$ (0≤y<x),
the second channel layer is formed of $Si_{1-z}Ge_z$ (x<z≤1), and
the spacer layer is formed of $Si_{1-w}Ge_w$ (x≤w<z).

14. A semiconductor device comprising:
a semiconductor substrate including a first region and a second region;
a first fin structure on the first region, the first fin structure including a first buffer pattern and a first channel pattern sequentially stacked;
a second fin structure on the second region, the second fin structure including a second buffer pattern, a second channel pattern on the second buffer pattern, and a spacer pattern disposed between the second buffer pattern and the second channel pattern,
a first metal-oxide-semiconductor (MOS) transistor provided on the first fin structure, a first gate electrode, and a first gate insulating layer between the first fin structure and the first gate electrode; and
a second MOS transistor provided on the second fin structure, a second gate electrode, and a second gate insulating layer between the second fin structure and the second gate electrode,
wherein the first and second buffer patterns include a first semiconductor material of which a lattice constant is different from that of the semiconductor substrate,
wherein the first channel pattern includes a second semiconductor material of which a lattice constant is smaller than the lattice constant of the first semiconductor material, wherein the second channel pattern includes a third semiconductor material of which a lattice constant is greater than the lattice constant of the first semiconductor material, and wherein the spacer pattern has a lattice constant that gradually increases from the second buffer pattern toward the second channel pattern.

15. The semiconductor device of claim 14, wherein:
the first and second buffer patterns, the first and second channel patterns, and the spacer pattern are formed of semiconductor materials including germanium (Ge),
a germanium concentration difference between the first channel pattern and the second channel pattern is greater than a germanium concentration difference between the second buffer pattern and the second channel pattern, and
the spacer pattern has a germanium concentration gradient.

16. The semiconductor device of claim 15, wherein:
the first and second buffer patterns are formed of $Si_{1-x}Ge_x$ (0<x<1),
the first channel pattern is formed of $Si_{1-y}Ge_y$ (0≤y<x),
the second channel pattern is formed of $Si_{1-z}Ge_z$ (x<z≤1), and
the spacer pattern is formed of $Si_{1-w}Ge_w$ (x≤w<z).

17. The semiconductor device of claim 14, wherein:
a top surface of the first channel pattern is coplanar with a top surface of the second channel pattern, and
a bottom surface of the spacer pattern is disposed at a lower level than or substantially the same level as a bottom surface of the first channel pattern.

18. An electronic device, comprising:
a semiconductor substrate having a first and a second regions;
a buffer layer formed on the semiconductor substrate on the first region and on the second region;
a first channel layer formed on the buffer layer on the first region;
a second channel layer formed on the buffer layer on the second region; and
a spacer layer formed between the buffer layer and the second channel layer,
wherein the lattice constant of the spacer layer increases gradually from a region adjacent to the buffer layer to a region adjacent to the second channel layer.

19. The electronic device of claim 18, wherein the spacer layer is formed of a semiconductor material including germanium (Ge), and the germanium concentration of the spacer layer increases gradually from a region adjacent to the buffer layer to a region adjacent to the second channel layer.

20. The electronic device of claim 19, wherein the germanium concentration of the spacer layer varies continuously.

21. The electronic device of claim 19, wherein the germanium concentration of the spacer layer varies discontinuously.

22. The electronic device of claim 18, wherein the lattice constant of the first channel layer is smaller than the lattice constant of the buffer layer, and the lattice constant of the buffer layer is smaller than the lattice constant of the second channel layer.

23. The electronic device of claim 18, further comprising:
a first gate electrode formed on the first channel layer;
first source/drain patterns disposed at both sides of the first gate electrode;

a second gate electrode formed on the second channel layer; and
second source/drain patterns disposed at both sides of the second gate electrode,
wherein the first gate electrode is electrically coupled to the second gate electrode, and a drain of the first source/drain patterns is electrically coupled to a drain of the second source/drain patterns.

24. A semiconductor device, comprising:
a semiconductor substrate including a first region and a second region;
a buffer layer on the first region and second region of the semiconductor substrate;
a first channel pattern on the buffer layer of the first region;
a spacer pattern on the buffer layer of the second region; and
a second channel pattern on the spacer pattern;
wherein the lattice constant of the spacer pattern increases from a surface of the spacer pattern adjacent to the buffer layer to a surface of the spacer pattern adjacent to the second channel pattern.

25. The semiconductor device of claim 24, wherein the lattice constant of the spacer pattern increases continuously from the surface adjacent to the buffer layer to the surface adjacent to the second channel pattern.

26. The semiconductor device of claim 25, wherein the lattice constant of the spacer pattern increases discontinuously from the surface adjacent to the buffer layer to the surface adjacent to the second channel pattern.

27. The semiconductor device of claim 24, wherein the spacer pattern is formed of a semiconductor material including germanium (Ge), and the germanium concentration of the spacer pattern increases gradually from a region adjacent to the buffer layer to a region adjacent to the second channel pattern.

28. The semiconductor device of claim 24, wherein the lattice constant of the first channel pattern is smaller than the lattice constant of the buffer layer, and the lattice constant of the buffer layer is smaller than the lattice constant of the second channel pattern.

29. The semiconductor device of claim 28, wherein the first channel pattern, the second channel pattern, and the buffer layer are formed of semiconductor materials including germanium (Ge), the germanium concentration of the second channel pattern is greater than the germanium concentration of the buffer layer, and the germanium concentration of the buffer layer is greater than the germanium concentration of the first channel pattern.

30. The semiconductor device of claim 24, further comprising:
a first gate insulating layer on the first channel pattern;
a first gate electrode pattern on the first gate insulating layer;
a second gate insulating layer on the second channel pattern;
a second gate electrode pattern on the second gate insulating layer;
first source/drain patterns at both sides of the first gate electrode pattern; and
second source/drain patterns at both sides of the second gate electrode pattern,
wherein the first gate electrode pattern is electrically coupled to the second gate electrode pattern, and a drain of the first source/drain pattern is electrically coupled to a drain of the second source/drain patterns.

* * * * *